United States Patent
Lee et al.

(10) Patent No.: US 12,382,769 B2
(45) Date of Patent: Aug. 5, 2025

(54) DISPLAY DEVICE WITH IMPROVED LIGHT EMISSION EFFICIENCY

(71) Applicant: Samsung Display Co., Ltd., Yongin-si (KR)

(72) Inventors: Hyun Wook Lee, Yongin-si (KR); Veidhes Basrur, Yongin-si (KR); Myung Seok Kwon, Yongin-si (KR); Ji Hyun Min, Yongin-si (KR); Sung Won Jo, Yongin-si (KR); Jung Eun Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 396 days.

(21) Appl. No.: 17/452,550

(22) Filed: Oct. 27, 2021

(65) Prior Publication Data
US 2022/0285426 A1 Sep. 8, 2022

(30) Foreign Application Priority Data
Mar. 4, 2021 (KR) .................. 10-2021-0028944

(51) Int. Cl.
*H10H 29/14* (2025.01)
*H10H 20/80* (2025.01)
(Continued)

(52) U.S. Cl.
CPC ........ *H10H 29/142* (2025.01); *H10H 20/821* (2025.01); *H10H 20/831* (2025.01);
(Continued)

(58) Field of Classification Search
CPC ....... H01L 27/156; H01L 33/24; H01L 33/38; H01L 33/44; H01L 33/50;
(Continued)

(56) References Cited

U.S. PATENT DOCUMENTS 11,094,741 B2 8/2021 Kim et al.
11,114,500 B2 9/2021 Lee et al.
(Continued)

FOREIGN PATENT DOCUMENTS

KR 10-2020-0014955 A 2/2020
KR 10-2020-0028065 A 3/2020
(Continued)

OTHER PUBLICATIONS

International Search Report, PCT/KR2022/002854, issued Jun. 10, 2022, 3 pages.

*Primary Examiner* — Chad M Dicke
*Assistant Examiner* — Jeremy Daniel Watts
(74) *Attorney, Agent, or Firm* — Womble Bond Dickinson (US) LLP

(57) ABSTRACT

A display device includes alignment electrodes spaced apart from each other, first and second light emitting elements between the alignment electrodes, a first pixel electrode electrically connected to first end portions of the first light emitting elements, a second pixel electrode electrically connected to second end portions of the first light emitting elements, a third pixel electrode electrically connected to the second pixel electrode and to first end portions of the second light emitting elements, a fourth pixel electrode electrically connected to second end portions of the second light emitting elements, and an insulating layer between the first pixel electrode and the second pixel electrode, wherein the insulating layer includes at least one opening exposing the second end portions of the first and second light emitting elements.

18 Claims, 11 Drawing Sheets

(51) Int. Cl.
*H10H 20/821* (2025.01)
*H10H 20/831* (2025.01)
*H10H 20/84* (2025.01)
*H10H 20/851* (2025.01)
*H10H 20/855* (2025.01)

(52) U.S. Cl.
CPC .......... *H10H 20/84* (2025.01); *H10H 20/851* (2025.01); *H10H 20/855* (2025.01); *H10H 20/882* (2025.01)

(58) Field of Classification Search
CPC ........... H01L 2933/0091; H01L 25/167; H01L 25/0753; H01L 33/22; H01L 33/58; H01L 27/1248; H01L 27/124; H01L 33/62
See application file for complete search history.

(56) References Cited

U.S. PATENT DOCUMENTS

| | | |
|---|---|---|
| 11,341,878 B2 | 5/2022 | Kim et al. |
| 2020/0258938 A1* | 8/2020 | Chai ................... H10D 86/60 |
| 2021/0098671 A1* | 4/2021 | Kawano ............ H01L 25/0753 |
| 2021/0217807 A1* | 7/2021 | Liu .................. H01L 25/0753 |
| 2022/0139319 A1 | 5/2022 | Oh et al. |
| 2022/0173160 A1* | 6/2022 | Pak ..................... H10H 20/831 |
| 2022/0238760 A1* | 7/2022 | Chen ................... H10H 20/855 |
| 2023/0275198 A1* | 8/2023 | Yamada ............... H10K 59/131 257/79 |
| 2023/0420618 A1* | 12/2023 | Kim ........................ H01L 25/16 |

FOREIGN PATENT DOCUMENTS

| | | |
|---|---|---|
| KR | 10-2020-0105598 A | 9/2020 |
| KR | 10-2020-0130606 A | 11/2020 |
| KR | 10-2020-0145900 A | 12/2020 |
| KR | 10-2021-0018582 A | 2/2021 |

\* cited by examiner

DISPLAY DEVICE WITH IMPROVED LIGHT EMISSION EFFICIENCY

CROSS-REFERENCE TO RELATED APPLICATION

The application claims priority to, and the benefit of, Korean patent application 10-2021-0028944 filed on Mar. 4, 2021 in the Korean Intellectual Property Office, the entire disclosure of which is incorporated herein by reference.

BACKGROUND

1. Field

The present disclosure generally relates to a display device.

2. Description of Related Art

As interest in information displays is increased, research and development of display devices have been continuously conducted.

SUMMARY

Embodiments provide a display device having improved light emission efficiency.

In accordance with an aspect of the present disclosure, there is provided a display device including alignment electrodes spaced apart from each other, first and second light emitting elements between the alignment electrodes, a first pixel electrode electrically connected to first end portions of the first light emitting elements, a second pixel electrode electrically connected to second end portions of the first light emitting elements, a third pixel electrode electrically connected to the second pixel electrode and to first end portions of the second light emitting elements, a fourth pixel electrode electrically connected to second end portions of the second light emitting elements, and an insulating layer between the first pixel electrode and the second pixel electrode, wherein the insulating layer includes at least one opening exposing the second end portions of the first and second light emitting elements.

The second pixel electrode may be in contact with the second end portions of the first light emitting elements through the at least one opening of the insulating layer.

The fourth pixel electrode may be in contact with the second end portions of the second light emitting elements through the at least one opening of the insulating layer.

The insulating layer may be between the second pixel electrode and the third pixel electrode.

The insulating layer may cover the first pixel electrode.

The insulating layer may cover the third pixel electrode.

The second pixel electrode may be electrically connected to the third pixel electrode through a contact hole penetrating the insulating layer.

The alignment electrodes may include a first alignment electrode, a second alignment electrode, and a third alignment electrode, wherein the first light emitting elements are between the first alignment electrode and the third alignment electrode, and wherein the second light emitting elements are between the first alignment electrode and the second alignment electrode.

The first end portions of the first and second light emitting elements may face the first alignment electrode.

The second end portions of the first light emitting elements may face the third alignment electrode, wherein the second end portions of the second light emitting elements face the second alignment electrode.

The first pixel electrode may be electrically connected to the first alignment electrode.

The fourth pixel electrode may be electrically connected to the second alignment electrode.

The fourth pixel electrode may be electrically connected to the second alignment electrode through a contact hole penetrating the insulating layer.

The at least one opening of the insulating layer may include a first opening exposing the second end portions of the first light emitting elements, and a second opening exposing the second end portions of the second light emitting elements, and
wherein the first alignment electrode is between the first opening and the second opening.

The first pixel electrode and the third pixel electrode may be in the same layer.

The second pixel electrode and the fourth pixel electrode may be in the same layer.

The at least one opening of the insulating layer may include a first opening exposing the second end portions of the first light emitting elements, and a second opening exposing the second end portions of the second light emitting elements, wherein the first end portions of the first and second light emitting elements are between the first opening and the second opening.

The display device may further include an emission area, a first non-emission area surrounding the emission area, and a second non-emission area spaced apart from the emission area with at least a portion of the first non-emission area interposed therebetween.

The display device may further include a bank in the first non-emission area.

The second pixel electrode and the third pixel electrode may be in contact with each other in the second non-emission area.

DETAILED DESCRIPTION

Figure 1:
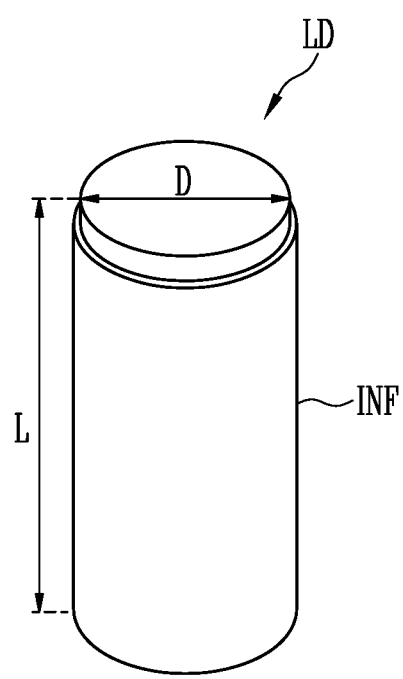
FIGS. 1 and 2 are perspective and sectional views illustrating a light emitting element in accordance with some embodiments of the present disclosure.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
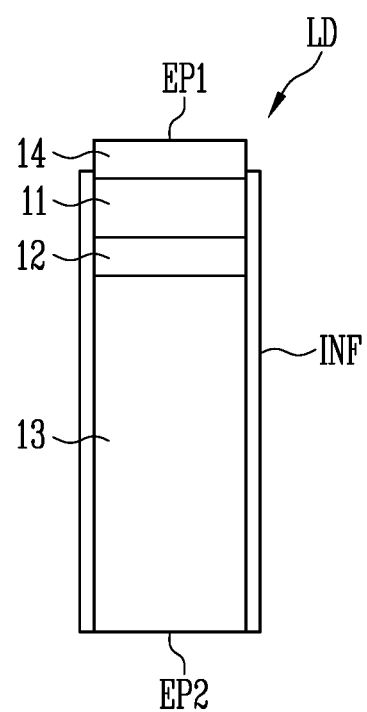

FIGS. 1 and 2 are perspective and sectional views illustrating a light emitting element in accordance with some embodiments of the present disclosure. Although a pillar-shaped light emitting element LD is illustrated in FIGS. 1 and 2, the kind and/or shape of the light emitting element LD is not limited thereto.

Referring to FIGS. 1 and 2, the light emitting element LD may include a first semiconductor layer 11, an active layer 12, a second semiconductor layer 13, and/or an electrode layer 14.

The light emitting element LD may be provided in a pillar shape extending along one direction. The light emitting element LD may have a first end portion EP1 and a second end portion EP2. One of the first and second semiconductor layers 11 and 13 may be located at the first end portion EP1 of the light emitting element LD, while the other of the first and second semiconductor layers 11 and 13 may be located at the second end portion EP2 of the light emitting element LD. For example, the first semiconductor layer 11 may be located at the first end portion EP1 of the light emitting element LD, and the second semiconductor layer 13 may be located at the second end portion EP2 of the light emitting element LD.

In some embodiments, the light emitting element LD may be a light emitting element manufactured in a pillar shape through an etching process, etc. In this specification, the term "pillar shape" may include a rod-like shape or bar-like shape, of which aspect ratio is greater than 1, such as a cylinder or a polyprism, and the shape of its section is not particularly limited.

The light emitting element LD may have a small size (e.g., to a degree of nanometer scale to micrometer scale). For example, the light emitting element LD may have a diameter D (or width) in a range of nanometer scale to micrometer scale and/or a length L in a range of nanometer scale to micrometer scale. However, the size of the light emitting element LD is not limited thereto, and the size of the light emitting element LD may be variously changed according to design conditions of various types of devices (e.g., a display device, and the like), which use, as a light source, a light emitting device using the light emitting element LD.

The first semiconductor layer 11 may be a first conductivity type semiconductor layer. For example, the first semiconductor layer 11 may include a p-type semiconductor layer. For example, the first semiconductor layer 11 may include at least one semiconductor material among InAlGaN, GaN, AlGaN, InGaN, AlN, and/or InN, and may include a p-type semiconductor layer doped with a first conductivity type dopant such as Mg. However, the material constituting the first semiconductor layer 11 is not limited thereto. In addition, the first semiconductor layer 11 may be configured with various materials.

The active layer 12 is formed between the first semiconductor layer 11 and the second semiconductor layer 13, and may be formed in a single-quantum well structure or a multi-quantum well structure. The position of the active layer 12 may be variously changed according to a kind of the light emitting element LD. In some embodiments, a material such as AlGaN or AlInGaN may be used to form the active layer 12. In addition, the active layer 12 may be configured with various materials. In some embodiments, a clad layer doped with a conductive dopant may be formed on the top and/or the bottom of the active layer 12. For example, the clad layer may be formed as an AlGaN layer or InAlGaN layer.

The second semiconductor layer 13 is formed on the active layer 12, and may include a semiconductor layer having a type that is different from that of the first semiconductor layer 11. For example, the second semiconductor layer 13 may include an n-type semiconductor layer. For example, the second semiconductor layer 13 may include any one semiconductor material among InAlGaN, GaN, AlGaN, InGaN, AlN, and/or InN, and may include an n-type semiconductor layer doped with a second conductivity type dopant such as Si, Ge or Sn. However, the material constituting the second semiconductor layer 13 is not limited thereto. In addition, the second semiconductor layer 13 may be configured with various materials.

When a voltage that is a threshold voltage or greater is applied to both ends of the light emitting element LD, the light emitting element LD emits light as electron-hole pairs are combined in the active layer 12. The light emission of the light emitting element LD is controlled by using such a principle, so that the light emitting element LD can be used as a light source for various light emitting devices, including a pixel of a display device.

The electrode layer 14 may be located on the first end portion EP1 and/or the second end portion EP2 of the light emitting element LD. Although a case where the electrode layer 14 is formed on the first semiconductor layer 11 is shown in FIG. 2, the present disclosure is not necessarily limited thereto. For example, a separate electrode layer may be further located on the second semiconductor layer 13.

The electrode layer 14 may include a transparent metal or a transparent metal oxide. For example, the electrode layer 14 may include at least one of indium tin oxide (ITO), indium zinc oxide (IZO), zinc oxide (ZnO), and/or zinc tin oxide (ZTO), but the present disclosure is not necessarily limited thereto. When the electrode layer 14 may be made of a transparent metal or a transparent metal oxide, light generated in the active layer 12 of the light emitting element LD may pass through the electrode layer 14 and then may be emitted to the outside of the light emitting element LD.

The light emitting element LD may further include an insulative film INF provided on a surface thereof. The insulative film INF may be located directly on surfaces of the first semiconductor layer 11, the active layer 12, the second semiconductor layer 13, and/or the electrode layer 14. The insulative film INF may expose the first and second end portions EP1 and EP2 of the light emitting element LD, which have different polarities. In some embodiments, the insulative film INF may expose a side portion of the electrode layer 14 and/or the second semiconductor layer 13 that is adjacent to the first and second end portions EP1 and EP2 of the light emitting element LD.

The insulative film INF may include at least one of aluminum oxide (AlOx), aluminum nitride (AlNx), silicon oxide (SiOx), silicon nitride (SiNx), silicon oxynitride (SiOxNy), zirconium oxide (ZrOx), hafnium oxide (HfOx), and/or titanium dioxide ($TiO_2$). For example, the insulative film INF may be configured as a double-layer, and layers constituting the double-layer may include different materials. The layers constituting the double layer of the insulative film INF may be formed through different processes. In some embodiments, the insulative film INF may be configured as a double-layer configured with aluminum oxide (AlOx) and silicon oxide (SiOx), but the present disclosure is not necessarily limited thereto. In some embodiments, the insulative film INF may be omitted.

When the insulative film INF is provided on the surface of the light emitting element LD, the insulative film INF can reduce or prevent the likelihood of the active layer 12 being short-circuited with at least one electrode (e.g., at least one of electrodes connected to both ends of the light emitting element LD), etc. Accordingly, the electrical stability of the light emitting element LD can be ensured. Also, the insulative film INF can reduce or minimize a surface defect of the light emitting element LD, thereby improving the lifespan and efficiency of the light emitting element LD.

A light emitting device including the above-described light emitting element LD may be used in various kinds of devices that require a light source, including a display device. For example, light emitting elements LD may be located in each pixel of a display panel, and may be used as a light source of each pixel. However, the application field of the light emitting element LD is not limited to the above-described example. For example, the light emitting element LD may be used in other types of devices that require a light source, such as a lighting device.

Figure 3:
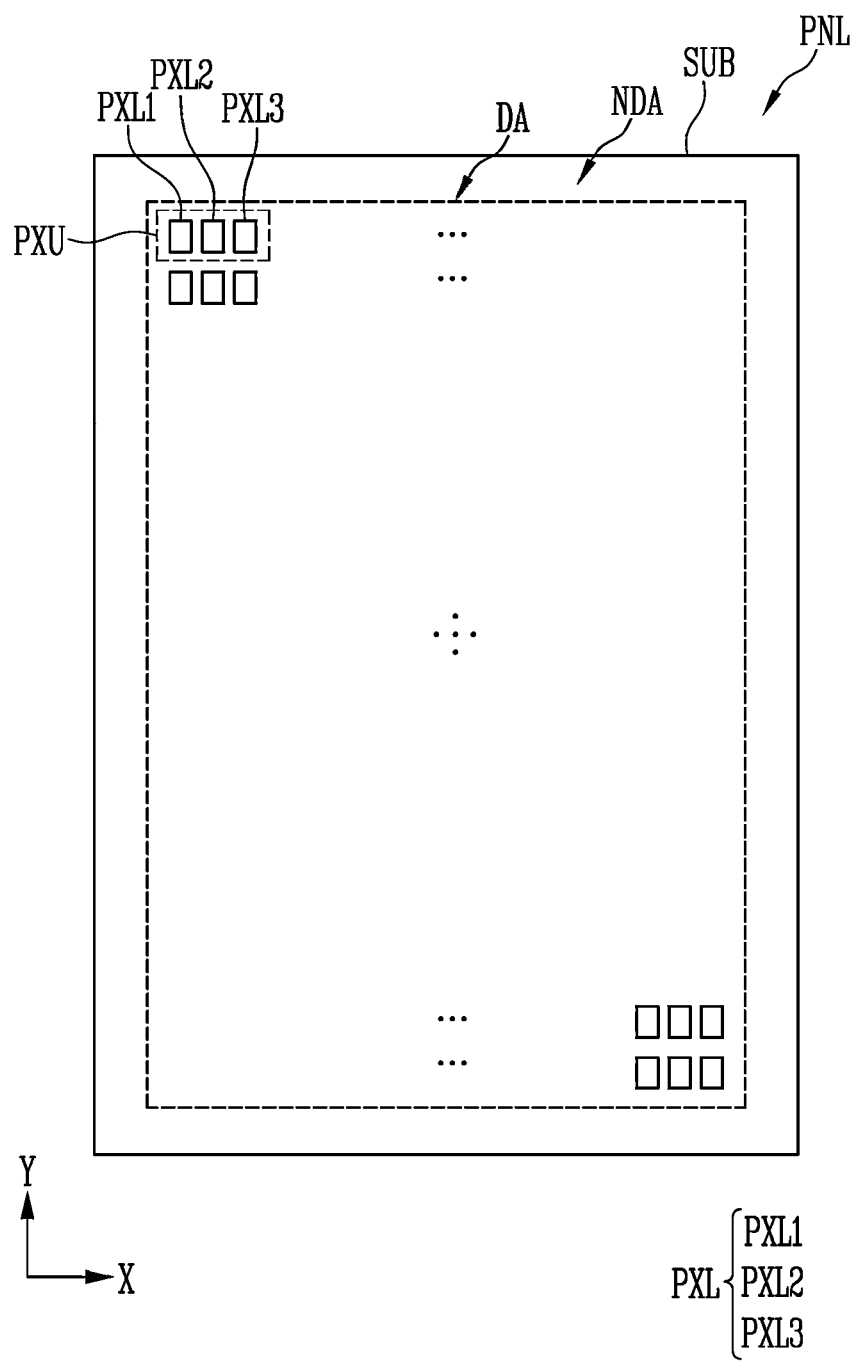
FIG. 3 is a plan view illustrating a display device in accordance with some embodiments of the present disclosure.

FIG. 3 is a plan view illustrating a display device in accordance with some embodiments of the present disclosure.

In FIG. 3, a display device, for example, a display panel PNL provided in the display device, will be illustrated as an example of an electronic device that can use, as a light source, the light emitting element LD described in the embodiments shown in FIGS. 1 and 2.

Each pixel unit PXU of the display panel PNL, and each pixel constituting the pixel unit PXU, may include at least one light emitting element LD. For convenience of description, in FIG. 3, a structure of the display panel PNL will be briefly illustrated based on a display area DA. However, in some embodiments, at least one driving circuit (e.g., at least one of a scan driver and/or a data driver), lines, and/or pads may be further located in the display panel PNL.

Referring to FIG. 3, the display panel PNL may include a substrate SUB and a pixel unit PXU located on the substrate SUB. The pixel unit PXU may include first color pixels PXL1, second color pixels PXL2, and/or third color pixels PXL3. Hereinafter, when at least one pixel among the first color pixels PXL1, the second color pixels PXL2, and/or the third color pixels PXL3 is arbitrarily designated, or when two or more kinds of pixels among the first color pixels PXL1, the second color pixels PXL2, and the third color pixels PXL3 are inclusively designated, the corresponding pixel or the corresponding pixels will be referred to as a "pixel PXL" or "pixels PXL."

The substrate SUB is used to constitute a base member of the display panel PNL, and may be a rigid or flexible substrate or a film. For example, the substrate SUB may be configured as a rigid substrate made of glass or tempered glass, or a flexible substrate (or thin film) made of a plastic or metal material. The material and/or property of the substrate SUB is not particularly limited.

The display panel PNL and the substrate SUB for forming the same may include a display area DA for displaying an image, and a non-display area NDA excluding the display area DA. Pixels PXL may be arranged in the display area DA. Various lines, pads, and/or a built-in circuit, which are connected to the pixels PXL of the display area DA, may be located in the non-display are NDA. The pixels PXL may be regularly arranged in the display area DA according to a stripe structure, a PENTILE® structure (e.g., a PENTILE® matrix structure, an RGBG structure, or a PENTILE® structure), or the like. PENTILE® is a registered trademark of Samsung Display Co., Ltd., Republic of Korea. However, the arrangement structure of the pixels PXL is not limited thereto, and the pixels PXL may be arranged in the display area DA by using various structures and/or methods.

In some embodiments, two or more kinds of pixels PXL emit lights of different colors. For example, first color pixels PXL1 for emitting light of a first color, second color pixels PXL2 for emitting light of a second color, and third color pixels PXL3 for emitting light of a third color may be arranged in the display area DA. At least one first color pixel PXL1, at least one second color pixel PXL2, and at least one third color pixel PXL3, which are located adjacent to each other, may constitute one pixel unit PXU capable of emitting lights of various colors. For example, each of the first to third pixels PXL1, PXL2, and PXL may be a sub-pixel for emitting light of a color (e.g., a predetermined color). In some embodiments, the first pixel PXL1 may be a red pixel for emitting light of red, the second pixel PXL2 may be a green pixel for emitting light of green, and the third pixel PXL3 may be a blue pixel for emitting light of blue. However, the present disclosure is not limited thereto.

In other embodiments, the first color pixel PXL1, the second color pixel PXL2, and the third color pixel PXL3 have light emitting elements for emitting light of the same color, and may include color conversion layers and/or color filters of different colors, which are located on the respective light emitting elements, to respectively emit lights of the first color, the second color, and the third color. In other embodiments, the first color pixel PXL1, the second color pixel PXL2, and the third color pixel PXL3 respectively have, as light sources, a light emitting element of the first color, a light emitting element of the second color, and a light emitting element of the third color, so that the light emitting elements can respectively emit lights of the first color, the second color, and the third color. However, the color, kind, and/or number of pixels PXL constituting each pixel unit PXU are not particularly limited. For example, the color of light emitted by each pixel PXL may be variously changed.

The pixel PXL may include at least one light source driven by a control signal (e.g., a predetermined control signal, such as a scan signal and a data signal) and/or a power source (e.g., a predetermined power source, such as a first power source and a second power source). In some embodiments, the light source may include at least one light emitting element LD in accordance with the embodiments of FIGS. 1 and 2 (e.g., a subminiature pillar-shaped light emitting element LD having a size small to a degree of nanometer scale to micrometer scale). However, the present disclosure is not necessarily limited thereto. In addition, various types of light emitting elements LD may be used as the light source of the pixel PXL.

In some embodiments, each pixel PXL may be configured as an active pixel. However, the kind, structure, and/or driving method of pixels PXL that can be applied to the display device are not particularly limited. For example, each pixel PXL may be configured as a pixel of a passive or active light emitting display device using various structures and/or driving methods.

Figure 4:
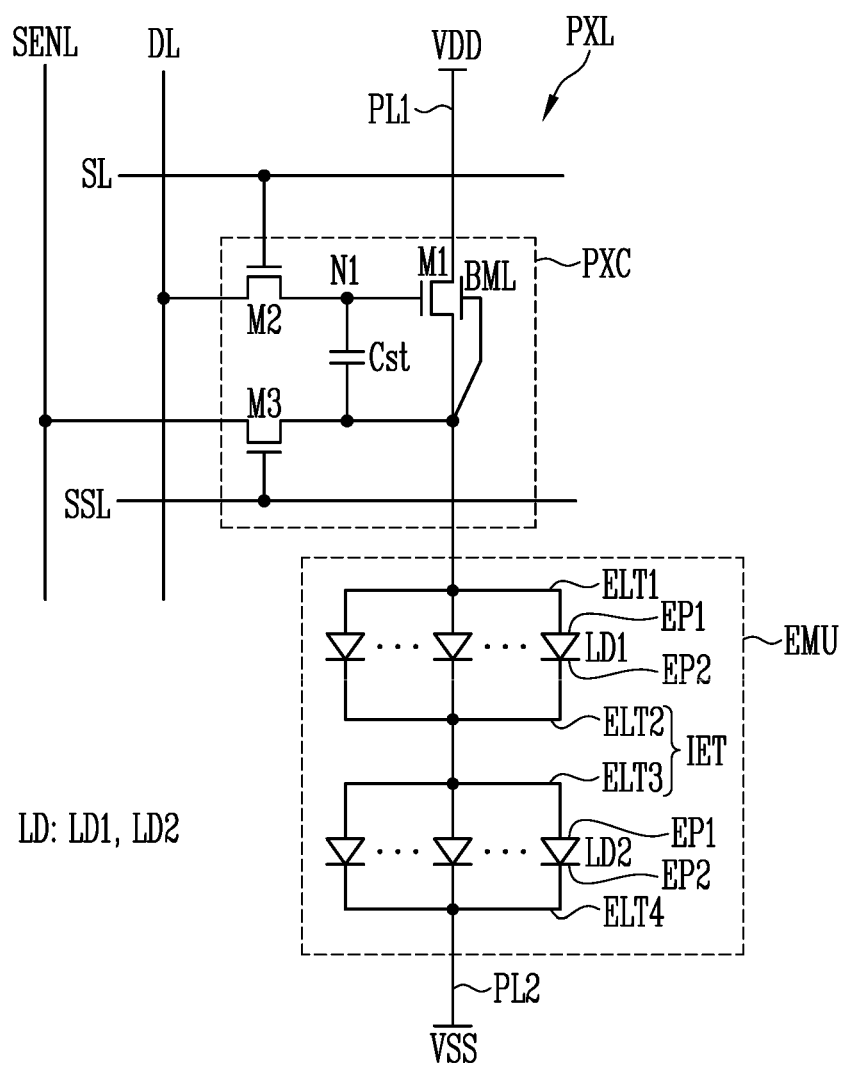
FIG. 4 is a circuit diagram illustrating a pixel in accordance with some embodiments of the present disclosure.

FIG. 4 is a circuit diagram illustrating a pixel in accordance with some embodiments of the present disclosure.

In some embodiments, the pixel PXL shown in FIG. 4 may be any one of the first pixel PXL1, the second pixel PXL2, and the third pixel PXL3, which are provided in the display panel PNL shown in FIG. 3. The first pixel PXL1, the second pixel PXL2, and the third pixel PXL3 may have structures substantially identical or similar to one another.

Referring to FIG. 4, the pixel PXL may include a light emitting unit EMU for generating light with a luminance corresponding to a data signal and a pixel circuit PXC for driving the light emitting unit EMU.

The pixel circuit PXC may be connected between a first power source VDD and the light emitting unit EMU. Also, the pixel circuit PXC may be connected to a scan line SL and a data line DL of the corresponding pixel PXL, to control an operation of the light emitting unit EMU, corresponding to a scan signal and the data signal, which are supplied from the scan line SL and the data line DL. Also, the pixel circuit PXC may be selectively further connected to a sensing signal line SSL and a sensing line SENL.

The pixel circuit PXC may include at least one transistor and a capacitor. For example, the pixel circuit PXC may include a first transistor M1, a second transistor M2, a third transistor M3, and a storage capacitor Cst.

The first transistor M1 may be connected between the first power source VDD and a first electrode ELT1. A gate electrode of the first transistor M1 is connected to a first node N1. The first transistor M1 may control a driving current supplied to the light emitting unit EMU, corresponding to a voltage of the first node N1. That is, the first transistor M1 may be a driving transistor for controlling the driving current of the pixel PXL.

In some embodiments, the first transistor M1 may selectively include a lower metal layer BML (also referred to as a "lower electrode," a "back gate electrode," or a "lower light blocking layer"). The gate electrode and the lower metal layer BML of the first transistor M1 may overlap with each other with an insulating layer interposed therebetween. In some embodiments, the lower metal layer BML may be connected to one electrode, e.g., a source or drain electrode of the first transistor M1.

When the first transistor M1 includes the lower metal layer BML, there may be applied a back-biasing technique (or sync technique) for moving a threshold voltage of the first transistor M1 in a negative direction or positive direction by applying a back-biasing voltage to the lower metal layer BML of the first transistor M1 in driving of the pixel PXL. For example, a source-sync technique is applied by connecting the lower metal layer BML to a source electrode of the first transistor M1, so that the threshold voltage of the first transistor M1 can be moved in the negative direction or positive direction. In addition, when the lower metal layer BML is located on the bottom of a semiconductor pattern constituting a channel of the first transistor M1, the lower metal layer BML may serve as a light blocking pattern, thereby stabilizing operational characteristics of the first transistor M1. However, the function and/or application method of the lower metal layer BML is not limited thereto.

The second transistor M2 may be connected between the data line DL and the first node N1. In addition, a gate electrode of the second transistor M2 is connected to the scan line SL. The second transistor M2 is turned on when a scan signal having a gate-on voltage (e.g., a high level voltage) is supplied from the scan line SL, to connect the data line DL and the first node N1 to each other.

A data signal of a corresponding frame may be supplied to the data line DL for each frame period. The data signal may be transferred to the first node N1 through the turned-on second transistor M2 during a period in which the scan signal having the gate-on voltage is supplied. That is, the second transistor M2 may be a switching transistor for transferring each data signal to the inside of the pixel PXL.

One electrode of the storage capacitor Cst may be connected to the first node N1, and the other electrode of the storage capacitor Cst may be connected to a second electrode of the first transistor M1. The storage capacitor Cst charges a voltage corresponding to the data signal supplied to the first node N1 during each frame period.

The third transistor M3 may be connected between the first pixel electrode ELT1 (or the second electrode of the first transistor M1) and the sensing line SENL. In addition, a gate electrode of the third transistor M3 may be connected to the sensing signal line SSL. The third transistor M3 may transfer a voltage value applied to the first pixel electrode ELT1 to the sensing line SENL according to a sensing signal supplied to the sensing signal line SSL. The voltage value transferred through the sensing line SENL may be provided to an external circuit (e.g., a timing controller), and the external circuit may extract characteristic information (e.g., the threshold voltage of the first transistor M1, etc.), based on the provided voltage value. The extracted characteristic information may be used to convert image data such that a characteristic deviation between the pixels PXL is compensated.

Meanwhile, although a case where the transistors included in the pixel circuit PXC are all implemented with an n-type transistor has been illustrated in FIG. 4, the present disclosure is not limited thereto. That is, at least one of the first, second, and/or third transistors M1, M2, and M3 may be changed to a p-type transistor.

In addition, the structure and driving method of the pixel PXL may be variously changed in some embodiments. For example, the pixel circuit PXC may be configured as a pixel circuit having various structures and/or various driving methods, in addition to the embodiments of FIG. 4.

For example, the pixel circuit PXC may not include the third transistor M3. Also, the pixel circuit PXC may further include other circuit elements such as a compensation transistor for compensating for the threshold voltage of the first transistor M1, etc., an initialization transistor for initializing a voltage of the first node N1 and/or the first pixel electrode ELT1, an emission control transistor for controlling a period in which a driving current is supplied to the light emitting unit EMU, and/or a boosting capacitor for boosting the voltage of the first node N1.

The light emitting unit EMU may include at least one light emitting element LD (e.g., a plurality of light emitting elements LD) connected between the first power source VDD and a second power source VSS.

For example, the light emitting unit EMU may include the first pixel electrode ELT1 (or "first electrode") connected to the first power source VDD through the pixel circuit PXC and through a first power line PL1, a fourth pixel electrode ELT4 (or "fourth electrode") connected to the second power source VSS through a second power line PL2, and a plurality of light emitting elements LD connected between the first to fourth pixel electrodes ELT1 and ELT4.

The first power source VDD and the second power source VSS may have different potentials such that the light emitting elements LD can emit light. For example, the first power source VDD may be set as a high-potential power source, and the second power source VSS may be set as a low-potential power source.

In some embodiments, the light emitting unit EMU may include at least one serial stage. Each serial stage may include a pair of electrodes (e.g., two electrodes) and at least one light emitting element LD connected in a forward direction between the pair of electrodes. The number of serial stages constituting the light emitting unit EMU and the number of light emitting elements LD constituting each serial stage are not particularly limited. For example, numbers of light emitting elements LD constituting the respective serial stages may be equal to or different from each other, and a number of light emitting elements LD is not particularly limited.

Referring to FIG. 4, the light emitting unit EMU may include a first serial stage including at least one first light emitting element LD1 and a second serial stage including at least one second light emitting element LD2.

The first serial stage may include the first pixel electrode ELT1, a second pixel electrode ELT2, and at least one first light emitting element LD1 connected between the first and second pixel electrodes ELT1 and ELT2. Each first light emitting element LD1 may be connected in the forward direction between the first and second pixel electrodes ELT1 and EL2. For example, a first end portion EP1 of the first light emitting element LD1 may be connected to the first pixel electrode ELT1, and a second end portion EP2 of the first light emitting element LD1 may be connected to the second pixel electrode ELT2.

The second serial stage may include a third pixel electrode ELT3, the fourth pixel electrode ELT4, and at least one second light emitting element LD2 connected to the third and fourth pixel electrodes ELT3 and ELT4. Each second light emitting element LD2 may be connected in the forward direction between the third and fourth pixel electrodes ELT3 and ELT4. For example, a first end portion EP1 of the second light emitting element LD2 may be connected to the third pixel electrode ELT3, and a second end portion EP2 of the second light emitting element LD2 may be connected to the fourth pixel electrode ELT4.

A first electrode, e.g., the first pixel electrode ELT1 of the light emitting unit EMU may be an anode electrode of the light emitting unit EMU. A last electrode, e.g., the fourth pixel electrode ELT4 of the light emitting unit EMU may be a cathode electrode of the light emitting unit EMU.

The other electrodes (e.g., the second pixel electrode ELT2 and the third pixel electrode ELT3) of the light emitting unit EMU may constitute an intermediate electrode IET. For example, the second pixel electrode ELT2 and the third pixel electrode ELT3 may be integrally or non-integrally connected to thereby constitute the intermediate electrode IET. The second pixel electrode ELT2 and the third pixel electrode ELT3 may be integrally considered as one intermediate electrode IET.

When light emitting elements LD are connected in a series/parallel structure, power efficiency can be improved as compared with when light emitting elements LD (of an equal number to that of the above-described light emitting elements LD) are connected only in parallel. In addition, in the pixel in which the light emitting elements LD are connected in the series/parallel structure, although a short failure or the like occurs in some serial stages, a luminance (e.g., a predetermined luminance) can be expressed through light emitting elements LD of the other serial stage. Hence, the probability that a dark spot failure will occur in the pixel PXL can be reduced. However, the present disclosure is not necessarily limited thereto, and the light emitting unit EMU may be configured by connecting the light emitting elements LD only in series or by connecting the light emitting elements LD only in parallel.

Each of the light emitting element LD may include a first end portion EP1 (e.g., a p-type end portion) connected to the first power source VDD via at least one electrode (e.g., the first pixel electrode EL1), the pixel circuit PXC, and/or the first power line PL1, and a second end portion EP2 (e.g., an n-type end portion) connected to the second power source VSS via at least another electrode (e.g., the fourth pixel electrode ELT4) and the second power line PL2. That is, the light emitting elements LD may be connected in the forward direction between the first power source VDD and the second power source VSS. The light emitting elements LD connected in the forward direction may constitute effective light sources of the light emitting unit EMU.

When a driving current is supplied through the corresponding pixel circuit PXC, the light emitting elements LD may emit light with a luminance corresponding to the driving current. For example, during each frame period, the pixel circuit PXC may supply, to the light emitting unit EMU, a driving current corresponding to a grayscale value to be expressed in a corresponding frame. Accordingly, while the light emitting elements LD emit light with the luminance corresponding to the driving current, the light emitting unit EMU can express the luminance corresponding to the driving current.

Figure 5:
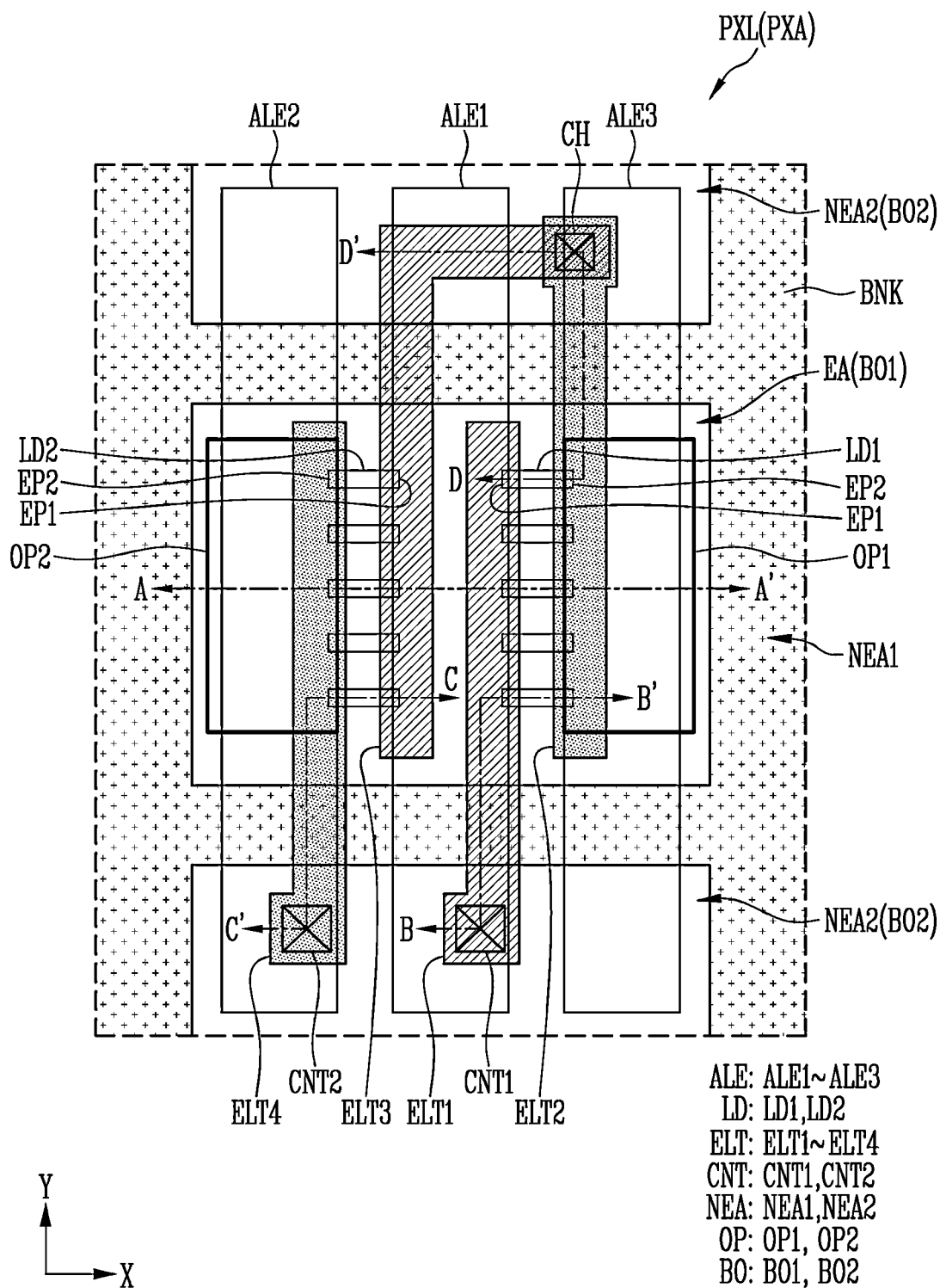
FIG. 5 is a plan view illustrating a pixel in accordance with some embodiments of the present disclosure.
Figure 6:
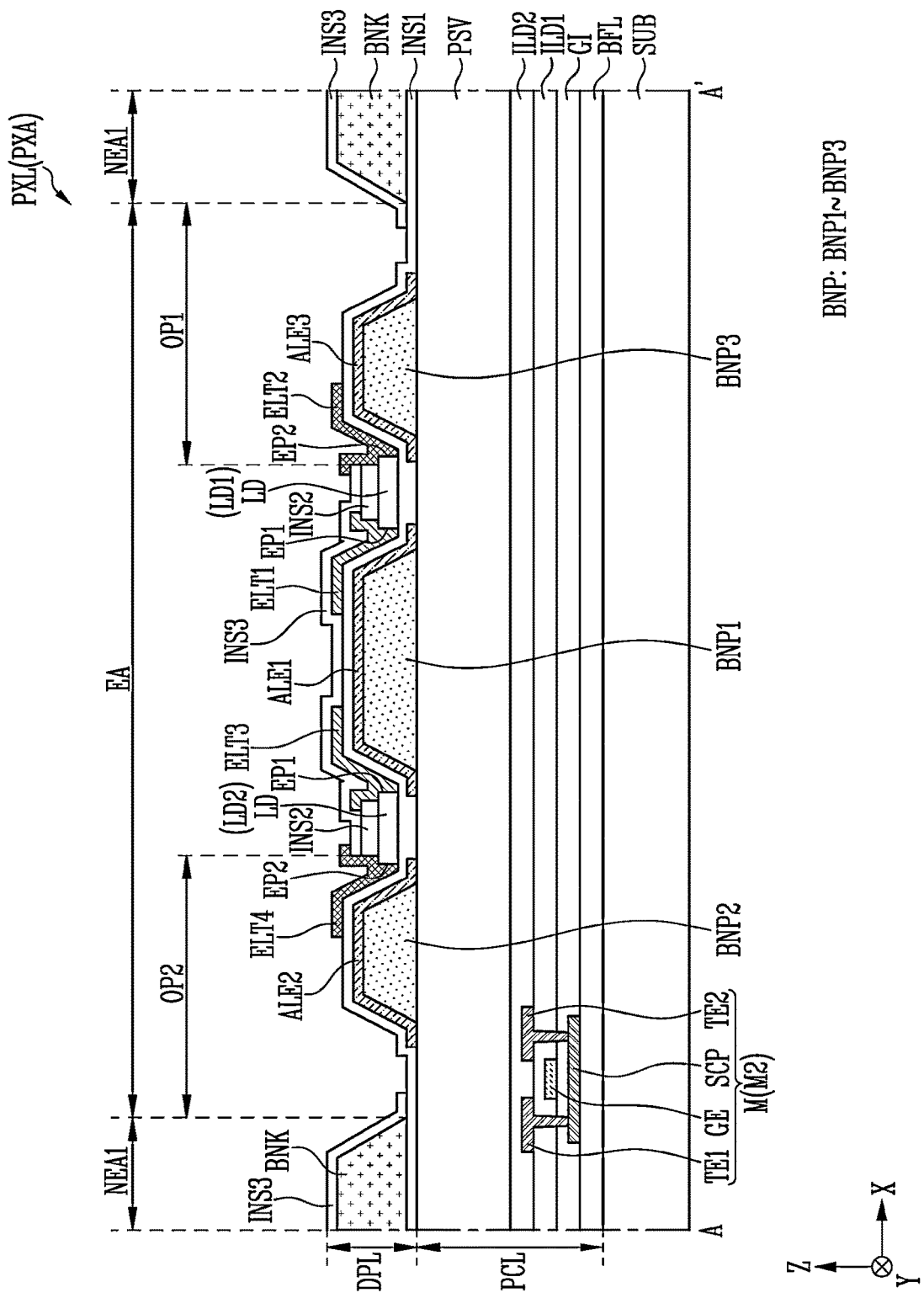
FIG. 6 is a sectional view taken along the line A-A' shown in FIG. 5.
Figure 7:
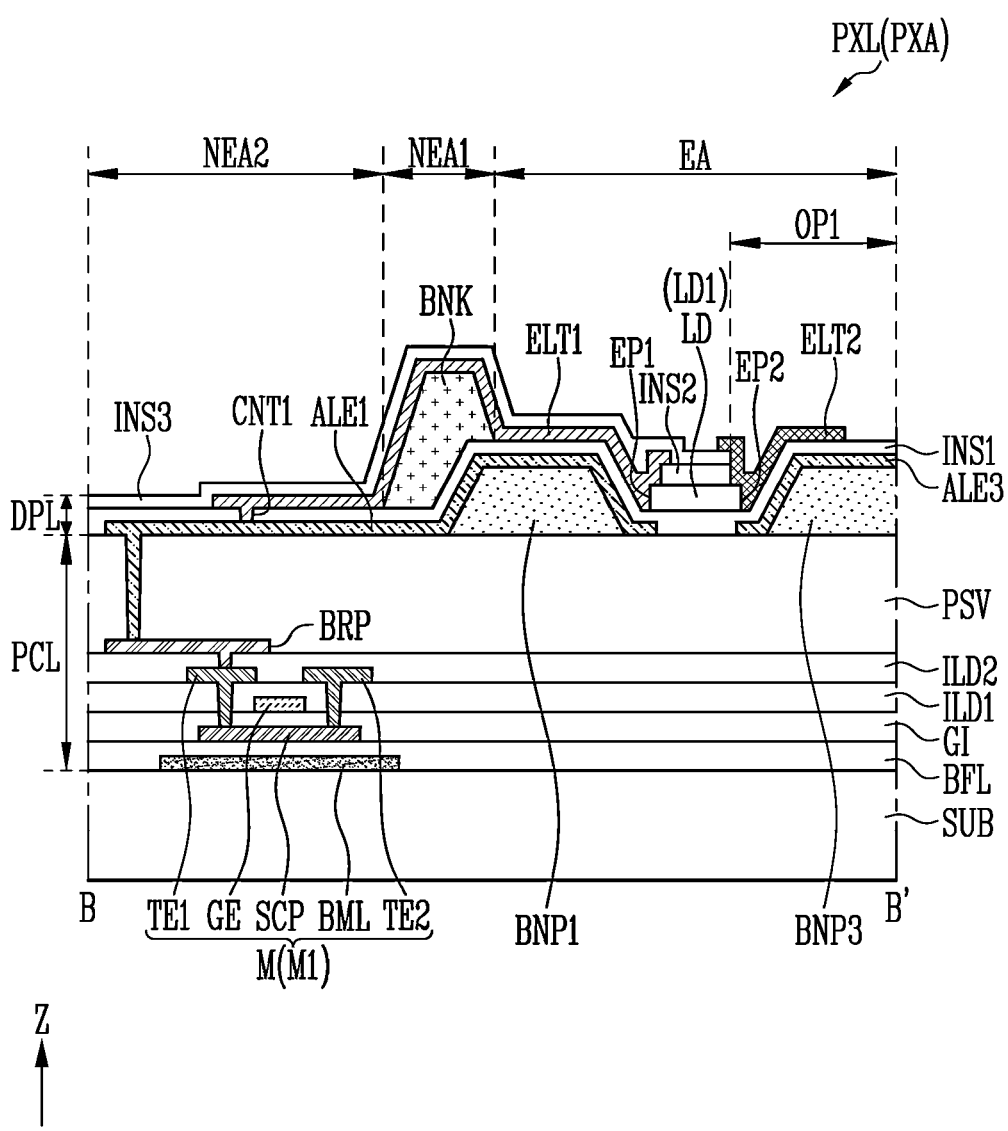
FIG. 7 is a sectional view taken along the line B-B' shown in FIG. 5.
Figure 8:
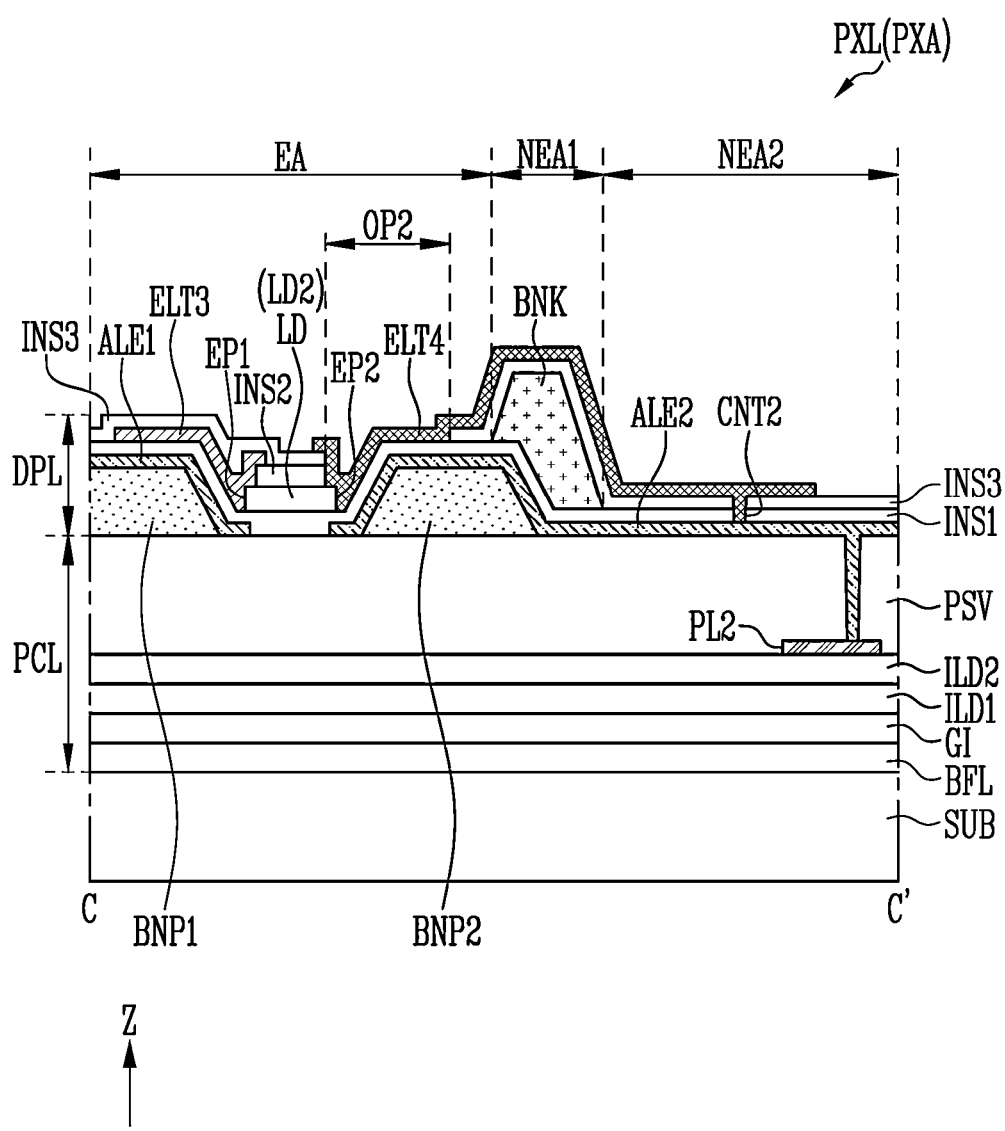
FIG. 8 is a sectional view taken along the line C-C' shown in FIG. 5.
Figure 9:
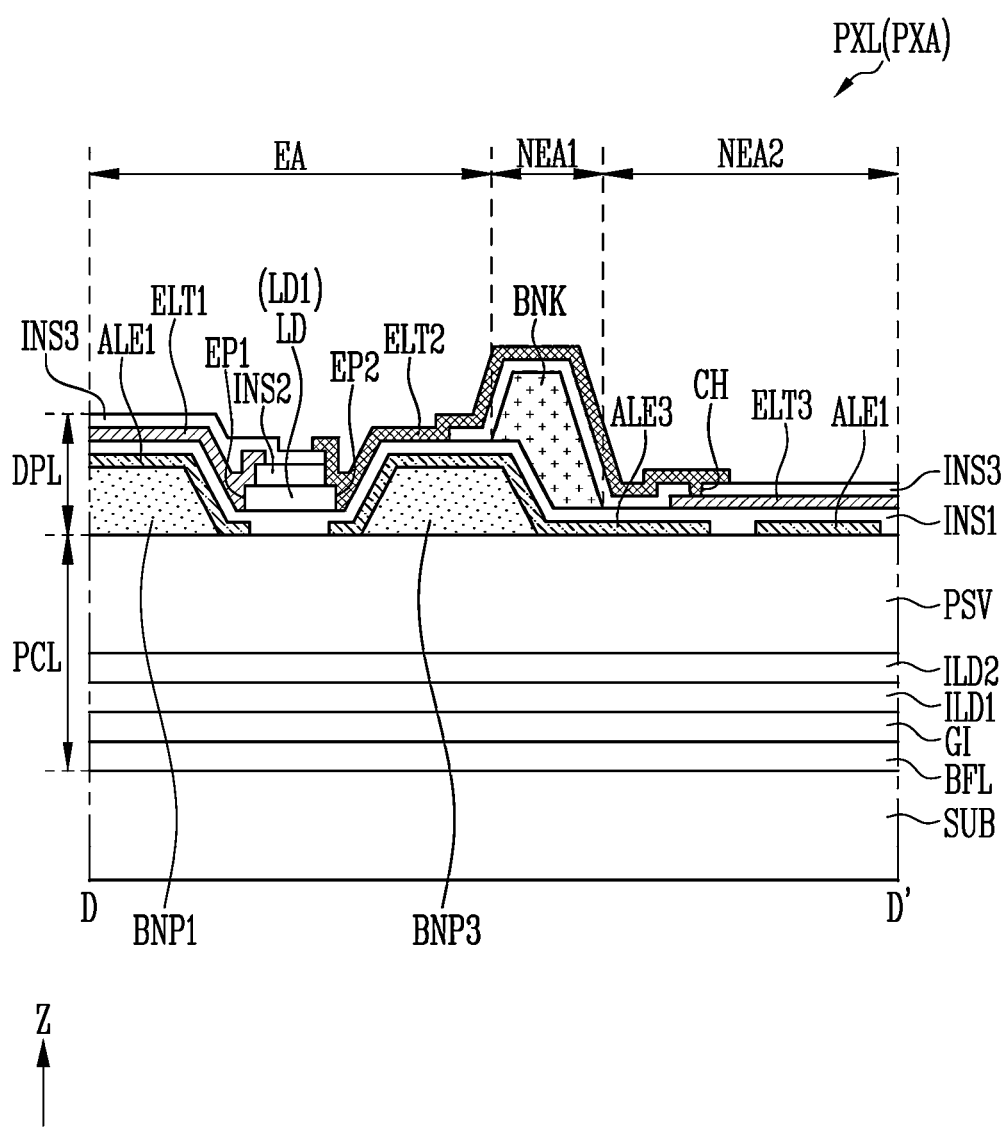
FIG. 9 is a sectional view taken along the line D-D' shown in FIG. 5.

FIG. 5 is a plan view illustrating a pixel in accordance with some embodiments of the present disclosure, FIG. 6 is a sectional view taken along the line A-A' shown in FIG. 5, FIG. 7 is a sectional view taken along the line B-B' shown in FIG. 5, FIG. 8 is a sectional view taken along the line C-C' shown in FIG. 5, and FIG. 9 is a sectional view taken along the line D-D' shown in FIG. 5.

For example, the pixel PXL may be any one of the first to third pixels PXL1, PXL2, and PXL3 constituting the pixel unit PXU shown in FIG. 3, and the first to third pixels PXL1, PXL2, and PXL3 may have structures that are substantially identical or similar to one another. In addition, although some embodiments in which each pixel PXL includes light emitting elements LD located in two serial stages, as shown in FIG. 4, is disclosed in FIG. 5, the number of serial stages of each pixel PXL may be variously changed in some embodiments.

Hereinafter, when at least one of first and second light emitting elements LD1 and LD2 is arbitrarily designated, or when two or more kinds of light emitting elements are inclusively designated, the corresponding light emitting element or the corresponding light emitting elements will be referred to as a "light emitting element LD" or "light emitting elements LD." In addition, when at least one electrode among alignment electrodes including first to third alignment electrodes ALE1, ALE2, and ALE3 is arbitrarily designated, the corresponding alignment electrode(s) will be referred to as an "alignment electrode ALE" or "alignment electrodes ALE." When at least one electrode among pixel electrodes including first to fourth pixel electrodes ELT1 to ELT4 is arbitrarily designated, the corresponding alignment electrode(s) will be referred to as a "pixel electrode ELT" or "pixel electrodes ELT."

Referring to FIG. 5, each pixel PXL may include an emission area EA, a first non-emission area NEA1, and a second non-emission area NEA2. The emission area EA may be an area including light emitting elements LD to emit light. The first non-emission area NEA1 may be located to surround the emission area EA. The first non-emission area NEA1 may be an area in which a bank BNK surrounding the emission area EA is provided. The second non-emission area NEA2 may be spaced apart from the emission area EA with the first non-emission area NEA1 interposed therebetween.

Each pixel PXL may include alignment electrodes ALE, light emitting elements LD, pixel electrodes ELT, and a bank BNK.

The alignment electrodes ALE may be provided in at least the emission area EA. The alignment electrodes ALE may extend along a second direction (Y-axis direction), and may be spaced apart from each other along a first direction (X-axis direction). The alignment electrodes ALE may extend to the second non-emission area NEA2 via the first non-emission area NEA1 from the emission area EA.

The alignment electrodes ALE may include first to third alignment electrodes ALE1, ALE2, and ALE3 spaced apart from each other. The first alignment electrode ALE1 may be located between the second alignment electrode ALE2 and the third alignment electrode ALE3. The first to third alignment electrodes ALE1, ALE2, and ALE3 may be supplied with different signals in a process of aligning the light emitting elements LD. For example, when the first alignment electrode ALE1 is located between the second alignment electrode ALE2 and the third alignment electrode ALE3, the second alignment electrode ALE2 and the third alignment electrode ALE3 may be supplied with the same alignment signal, and the first alignment electrode ALE1 may be supplied with an alignment signal that is different from that of the second alignment electrode ALE2 and/or the third alignment electrode ALE3. However, the present disclosure is not necessarily limited thereto, and the alignment signals supplied to the first to third alignment electrodes ALE1, ALE2, and ALE3 may be variously changed.

The light emitting elements LD may be respectively located between the alignment electrodes ALE in the emission area EA. A first light emitting element LD1 may be located between the first alignment electrode ALE1 and the third alignment electrode ALE3. A first end portion EP1 of the first light emitting element LD1 may face the first alignment electrode ALE1, and a second end portion EP2 of the first light emitting element LD1 may face the third alignment electrode ALE3.

The first light emitting element LD1 may be electrically connected between first and second pixel electrodes ELT1 and ELT2. For example, the first end portion EP1 of the first light emitting element LD1 may be electrically connected to the first pixel electrode ELT1, and the second end portion EP2 of the first light emitting element LD1 may be electrically connected to the second pixel electrode ELT2.

A second light emitting element LD2 may be located between the first alignment electrode ALE1 and the second alignment electrode ALE2. A first end portion EP1 of the second light emitting element LD2 may face the first alignment electrode ALE1, and a second end portion EP2 of the second light emitting element LD2 may face the second alignment electrode ALE2.

The second light emitting element LD2 may be electrically connected between third and fourth pixel electrodes ELT3 and ELT4. For example, the first end portion EP1 of the second light emitting element LD2 may be electrically connected to the third pixel electrode ELT3, and the second end portion EP2 of the second light emitting element LD2 may be electrically connected to the fourth pixel electrode ELT4.

For example, the first light emitting element LD1 may be located in a right area of the emission area EA, and the second light emitting element LD2 may be located in a left area of the emission area EA. However, the arrangement and/or connection structure of the light emitting elements LD may be variously changed according to the structure of the light emitting unit EMU and/or the number of serial stages.

Each of the pixel electrodes ELT may be provided at least at the emission area EA, and may be located to overlap with at least one alignment electrode ALE and/or the light emitting element LD. For example, each pixel electrode ELT may be formed on alignment electrodes ALE and/or light emitting elements LD while overlapping with the alignment electrodes ALE and/or the light emitting elements LD, to be electrically connected to the alignment electrodes ALE and/or the light emitting elements LD.

The first pixel electrode ELT1 may be located on the first end portions EP1 of the first light emitting elements LD1 to be electrically connected to the first end portions EP1 of the first light emitting elements LD1. Also, the first pixel electrode ELT1 may be electrically connected to the first alignment electrode ALE1. The first pixel electrode ELT1 may electrically connect the first end portions EP1 of the first light emitting elements LD1 to the first alignment electrode ALE1. The first pixel electrode ELT1 may be connected to a pixel circuit PXC and/or a power line (e.g., a predetermined power line) through the first alignment electrode ALE1. For example, the first pixel electrode ELT1 may be electrically connected to the pixel circuit PXC and/or the first power line PL1 through the first alignment electrode ALE1. In some embodiments, the first pixel electrode ELT1 may be electrically connected to the first alignment electrode ALE1 through a first contact part CNT1 formed in the second non-emission area NEA2, but the position of the first contact part CNT1 is not necessarily limited thereto.

The second pixel electrode ELT2 may be located on the second end portions EP2 of the first light emitting elements LD1 to be electrically connected to the second end portions EP2 of the first light emitting elements LD1. The second pixel electrode ELT2 may be in contact with the second end portions EP2 of the first light emitting elements LD1 through a first opening OP1 exposing the second end portions EP2 of the first light emitting elements LD1. This will be described in detail later with reference to FIG. 6. In some embodiments, the second pixel electrode ELT2 may at least partially overlap with the third alignment electrode ALE3, but the present disclosure is not necessarily limited thereto.

The third pixel electrode ELT3 may be located on the first end portions EP1 of the second light emitting elements LD2 to be electrically connected to the first end portions EP1 of the second light emitting elements LD2. Also, the third pixel electrode ELT3 may be electrically connected to the second pixel electrode ELT2. For example, the second pixel electrode ELT2 and the third pixel electrode ELT3 may extend up to the second non-emission area NEA2 via the first non-emission area NEA1 from the emission area EA, and the third pixel electrode ELT3 may be electrically connected to the second pixel electrode ELT2 through a contact hole CH formed in the second non-emission area NEA2. Accordingly, the second end portions EP2 of the first light emitting elements LD1 may be electrically connected to the first end portions EP1 of the second light emitting elements LD2 through the second pixel electrode ELT2 and/or the third pixel electrode ELT3. In some embodiments, the third pixel electrode ELT3 may at least partially overlap with the first alignment electrode ALE1, but the present disclosure is not necessarily limited thereto.

The fourth pixel electrode ELT4 may be located on the second end portions EP2 of the second light emitting elements LD2 to be electrically connected to the second end portions EP2 of the second light emitting elements LD2. The fourth pixel electrode ELT4 may be in contact with the second end portions EP2 of the second light emitting elements LD2 through a second opening OP2 exposing the second end portions EP2 of the second light emitting elements LD2. This will be described in detail later with reference to FIG. 6.

Also, the fourth pixel electrode ELT4 may be electrically connected to the second alignment electrode ALE2. The fourth pixel electrode ELT4 may electrically connect the second end portions EP2 of the second light emitting elements LD2 to the second alignment electrode ALE2. The fourth pixel electrode ELT4 may be connected to the pixel circuit PXC and/or a power line (e.g., a predetermined power line) through the second alignment electrode ALE2. For example, the fourth pixel electrode ELT4 may be electrically connected to the second power line PL2 through the second alignment electrode ALE2. In some embodiments, the fourth pixel electrode ELT4 may be electrically connected to the second alignment electrode ALE2 through a second contact part CNT2 formed in the second non-emission area NEA2, but the position of the second contact part CNT2 is not necessarily limited thereto. As described above, when the contact part CNT and the contact hole CH are located in the second non-emission area NEA2, the contact part CNT and the contact hole CH can be formed while avoiding the emission area EA in which the light emitting elements LD are supplied and aligned. Accordingly, a more uniform electric field can be formed in the emission area EA in a process of aligning the light emitting elements LD, and separation of the light emitting elements LD can be reduced or prevented.

In the above-described manner, the light emitting elements LD aligned between the alignment electrodes ALE may be electrically connected in a desired form by using the pixel electrodes ELT. For example, the first light emitting elements LD1 and the second light emitting elements LD2 may be sequentially connected in series by using the pixel electrodes ELT.

The bank BNK may be provided in the first non-emission area NEA1 to surround the emission area EA and the second non-emission area NEA2. Also, the bank BNK may be provided between an outer portion of each pixel area PXA and/or adjacent pixel areas PXA to include a plurality of bank openings BO corresponding to the emission area EA and the second non-emission area NEA2 of the pixel PXL. For example, the bank BNK may include a first bank opening BO1 overlapping with the emission area EA and a second bank opening B02 overlapping with the second non-emission area NEA2. That is, the bank BNK may include the first bank opening BO1 defining the emission area EA, and the second bank opening BO2 defining the second non-emission area NEA2.

The bank BNK may form a dam structure defining the emission area to which the light emitting elements LD are to be supplied in a process of supplying the light emitting elements LD. For example, the emission area EA is partitioned by the bank
BNK, so that a desired kind and/or amount of light emitting element ink can be supplied to the emission area EA.

The bank BNK may include at least one light blocking and/or reflective material. Accordingly, light leakage between adjacent pixels PXL can be reduced or prevented. For example, the bank BNK may include at least one black matrix material and/or at least one color filter material. For example, the bank BNK may be formed as a black opaque pattern capable of blocking transmission of light. In some embodiments, a reflective layer or the like may be formed on a surface (e.g., a sidewall) of the bank BNK so as to improve the light efficiency of each pixel PXL.

Hereinafter, based on one light emitting element LD, a sectional structure of each pixel PXL will be described in detail with reference to FIGS. 6 to 9. A second transistor M2 among various circuit elements constituting a pixel circuit PXC is illustrated in FIG. 6, and a first transistor M1 is illustrated in FIG. 7. Hereinafter, when the first transistor M1 and the second transistor M2 are designated without being distinguished from each other, each of the first transistor M1 and the second transistor M2 will be inclusively referred to as a "transistor M." Meanwhile, the structure of transistors M and/or the positions of the transistors M for each layer is not limited to the embodiments of FIGS. 6 and 7, and may be variously changed in some embodiments.

Referring to FIGS. 6 to 9, the pixel PXL and the display panel PNL including the same in accordance with embodiments of the present disclosure may include a circuit layer PCL and a display layer DPL, which are located on one surface of a substrate SUB.

Circuit elements (e.g., transistors M and a storage capacitor Cst) constituting a pixel circuit PXC of a corresponding pixel PXL and various lines connected thereto may be located in the circuit layer PCL. Alignment electrodes ALE, light emitting elements LD, and/or pixel electrodes ELT, which constitute a light emitting unit EMU of the corresponding pixel PXL, may be located in the display layer DPL.

For example, the substrate SUB is used to constitute a base member, and may be a rigid or flexible substrate or a film. For example, the substrate SUB may be a rigid substrate made of glass or tempered glass, a flexible substrate (or thin film) made of a plastic or metal material, or at least one insulating layer. The material and/or property of the substrate SUB is not particularly limited. In some embodiments, the substrate SUB may be substantially transparent. The term "substantially transparent" may mean that light can be transmitted with a given transmittance (e.g., a predetermined transmittance) or more. In other embodiments, the substrate SUB may be translucent or opaque. Also, the substrate SUB may include a reflective material in some embodiments.

Transistors M may be located on the substrate SUB. Each of the transistors M may include a semiconductor pattern SCP, a gate electrode GE, and first and second transistor electrodes TE1 and TE2, and may selectively further include a lower metal layer BML.

The lower metal layer BML may be located on the substrate SUB. The lower metal layer BML may overlap with the gate electrode GE and/or the semiconductor pattern SCP of at least one transistor M (e.g., a first transistor M1).

A buffer layer BFL may be located over the lower metal layer BML. The buffer layer BFL may reduce or prevent impurities from being diffused into each circuit element. The buffer layer BFL may be configured as a single layer, or may be configured as a multi-layer including at least two layers. When the buffer layer BFL is provided as the multi-layer, the layers may be formed of the same material or be formed of different materials.

The semiconductor pattern SCP may be located on the buffer layer BFL. For example, the semiconductor pattern SCP may include a first region in contact with the first transistor electrode TE1, a second region in contact with the second transistor electrode TE2, and a channel region located between the first and second regions. In some embodiments, one of the first and second regions may be a source region, and the other of the first and second regions may be a drain region.

In some embodiments, the semiconductor pattern SCP may be made of poly-silicon, amorphous silicon, oxide semiconductor, etc. In addition, the channel region of the semiconductor pattern SCP is a semiconductor pattern undoped with an impurity, and may be an intrinsic semiconductor. Each of the first and second regions of the semiconductor pattern SCP may be a semiconductor pattern doped with an impurity (e.g., a predetermined impurity).

A gate insulating layer GI may be located over the semiconductor pattern SCP. For example, the gate insulating layer GI may be located between the semiconductor pattern SCP and the gate electrode GE. The gate insulating layer GI may be configured as a single layer or a multi-layer, and may include various kinds of inorganic insulating materials, including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The gate electrode GE may be located on the gate insulating layer GI. The gate electrode GE may be located on the gate insulating layer GI to overlap with the semiconductor pattern SCP in a third direction (Z-axis direction).

A first interlayer insulating layer ILD1 may be located over the gate electrode GE. For example, the first interlayer insulating layer ILD1 may be located between the gate electrode GE and the first and second transistor electrodes TE1 and TE2. The first interlayer insulating layer ILD may be configured as a single layer or a multi-layer, and may include various kinds of inorganic insulating materials, including silicon oxide
(SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The first and second transistor electrodes TE1 and TE2 may be located on the first interlayer insulating layer ILD1. The first and second transistor electrodes TE1 and TE2 may be located to overlap with the semiconductor pattern SCP in the third direction (Z-axis direction). The first and second transistor electrodes TE1 and TE2 may be electrically connected to the semiconductor pattern SCP. For example, the first transistor electrode TE1 may be electrically connected to the first region of the semiconductor pattern SCP through a contact hole penetrating the first interlayer insulating layer ILD and the gate insulating layer GI. The second transistor electrode TE2 may be electrically connected to the second region of the semiconductor pattern SCP through a contact hole penetrating the first interlayer insulating layer ILD and the gate insulating layer GI. In some embodiments, any one of the first and second transistor electrodes TE1 and TE2 may be a source electrode, and the other of the first and second transistor electrodes TE1 and TE2 may be a drain electrode.

A second interlayer insulating layer ILD2 may be located over the first and second transistor electrodes TE1 and TE2. The second interlayer insulating layer ILD2 may be configured as a single layer or a multi-layer, and may include various kinds of inorganic insulating materials, including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

A bridge electrode BRP and/or a second power line PL2, as shown in FIG. 7, may be located on the second interlayer insulating layer ILD2. The bridge pattern BRP may be electrically connected to the first transistor electrode TE 1 through a contact hole penetrating the second interlayer insulating layer ILD2. The bridge electrode BRP and the second power line PL2 may be configured as the same conductive layer. That is, the bridge electrode BRP and the second power line PL2 may be concurrently/substantially simultaneously formed through the same process, but the present disclosure is not limited thereto.

A protective layer PSV may be located on the top of the circuit elements including the transistors M. The protective layer PSV may be made of an organic material to planarize a lower step difference. For example, the protective layer PSV may include an organic material, such as acryl resin, epoxy resin, phenolic resin, polyamides resin, polyimides resin, unsaturated polyesters resin, poly-phenylene ethers resin, poly-phenylene sulfides resin, and/or benzocyclobutene (BCB). However, the present disclosure is not necessarily limited thereto, and the protective layer PSV may include various kinds of inorganic insulating materials, including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The display layer DPL may be located on the protective layer PSV of the circuit layer PCL. The display layer DPL may include patterns BNP, alignment electrodes ALE, light emitting elements LD, and/or pixel electrodes ELT.

The patterns BNP may be located on the protective layer PSV. The patterns BNP may include first to third patterns BNP1, BNP2, and BNP3 spaced apart from each other. The first pattern BNP1 may be located between the second pattern BNP2 and the third pattern BNP3.

In some embodiments, the patterns BNP may have various shapes. In some embodiments, the patterns BNP may have a shape protruding in the third direction (Z-axis direction) on the substrate SUB. Also, the patterns BNP may have an inclined surface inclined at an angle (e.g., a predetermined angle) with respect to the substrate SUB. However, the present disclosure is not necessarily limited thereto, and the patterns BNP may have a sidewall(s) having a curved shape, a stepped shape, or the like. For example, the patterns BNP may have a section having a semicircular shape, a semi-elliptical shape, or the like.

Electrodes and insulating layers, which are located on the top of the patterns BNP, may have a shape corresponding to the patterns BNP. For example, the alignment electrodes ALE located on the patterns BNP may include an inclined surface or a curved surface, which has a shape corresponding to that of the patterns BNP. Accordingly, the patterns BNP, along with the alignment electrodes ALE provided on the top thereof, may serve as a reflective member for guiding light emitted from the light emitting elements LD in a front direction of the pixel PXL (e.g., the third direction/Z-axis direction), thereby improving the light emission efficiency of the display panel PNL.

The patterns BNP may include at least one organic material and/or at least one inorganic material. For example, the patterns BNP may include an organic material such as acryl resin, epoxy resin, phenolic resin, polyamides resin, polyim ides resin, unsaturated polyesters resin, poly-phenylene ethers resin, poly-phenylene sulfides resin, or benzocyclobutene (BCB). However, the present disclosure is not necessarily limited thereto, and the patterns BNP may include various kinds of inorganic insulating materials, including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

Each of the alignment electrodes ALE may be located on at least one pattern BNP. For example, a first alignment electrode ALE1 may be located on one area of the first pattern BNP1, a second alignment electrode ALE2 may be located on one area of the second pattern BNP2, and a third alignment electrode ALE3 may be located on one area of the third pattern BNP3.

The alignment electrodes ALE may be located to be spaced apart from each other in the emission area EA. The alignment electrodes ALE may be supplied with an alignment signal in a process of aligning the light emitting elements LD as described above. Accordingly, an electric field is formed between the alignment electrodes ALE, so that the light emitting elements LD supplied to each pixel may be aligned between respective alignment electrodes ALE.

At least one of the alignment electrodes ALE may be electrically connected to the circuit elements of the circuit layer PCL. For example, as shown in FIG. 7, the first alignment electrode ALE1 may be electrically connected to the bridge electrode BRP through a contact hole penetrating the protective layer PSV, and accordingly may be electrically connected to the transistor M. In addition, as shown in FIG. 8, the second alignment electrode ALE2 may be electrically connected to the second power line PL2 through a contact hole penetrating the protective layer PSV.

Each of the alignment electrodes ALE may include at least one conductive material. For example, each of the alignment electrodes ALE may include at least one metal or any alloy including the same among various metallic materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), and/or the like, at least one conductive oxide such as Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and/or Fluorine doped Tin Oxide (FTO), and at least one conductive material among conductive polymers such as PEDOT, but the present disclosure is not necessarily limited thereto.

A first insulating layer INS1 may be located over the alignment electrodes ALE. The first insulating layer INS1 may be configured as a single layer or a multi-layer, and may include various kinds of inorganic insulating materials, including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

A bank BNK may be located on the first insulating layer INS of the first non-emission area NEA1. For example, the bank BNK may be provided in the first non-emission area NEA1 to surround the emission area EA and the second non-emission area NEA2.

The bank BNK may include at least one organic material and/or at least one inorganic material. For example, the bank BNK may include an organic material, such as acryl resin, epoxy resin, phenolic resin, polyamides resin, polyimides resin, unsaturated polyesters resin, poly-phenylene ethers resin, poly-phenylene sulfides resin, or benzocyclobutene (BCB). However, the present disclosure is not necessarily limited thereto, and the bank BNK may include various kinds of inorganic insulating materials, including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The light emitting elements LD may be located on the first insulating layer INS1 of the emission area EA. The light emitting elements LD may be located between the alignment electrodes ALE on the first insulating layer INS1. The light emitting elements LD may be prepared in a form in which the light emitting elements LD are dispersed in a solution (e.g., a predetermined solution) to be supplied to each of the pixels PXL through an inkjet printing process, or the like. For example, the light emitting elements LD may be provided to the emission area of each of the pixels PXL while being dispersed in a volatile solvent. In the process of aligning the light emitting elements LD, when an alignment signal is supplied through the alignment electrodes ALE, the light emitting elements LD may be aligned between the alignment electrodes ALE, while an electric field is formed between the alignment electrodes ALE. After the light emitting elements LD are aligned, the solvent may be volatilized or removed in another manner so that the light emitting elements LD can be stably arranged between the alignment electrodes ALE.

A second insulating layer INS2 may be located on the light emitting elements LD. The second insulating layer INS2 may be partially located on the light emitting elements LD. When the second insulating layer INS2 is formed on the light emitting elements LD after the alignment of the light emitting elements LD is completed, the light emitting elements LD may be secured to be prevented from being separated from a position at which the light emitting elements LD are aligned. The second insulating layer INS2 is located on the light emitting elements LD, and may expose first and second end portions EP1 and EP2 of the light emitting elements LD.

The second insulating layer INS2 may be configured as a single layer or a multi-layer, and may include various kinds of inorganic insulating materials, including silicon oxide (SiOx), silicon nitride (SiNx), silicon oxynitride (SiOxNy), aluminum nitride (AlNx), aluminum oxide (AlOx), zirconium oxide (ZrOx), hafnium oxide (HfOx), and/or titanium oxide (TiOx).

The pixel electrodes ELT may be located on the first and second end portions EP1 and EP2 of the light emitting elements LD, which are exposed by the second insulating layer INS2. The pixel electrodes ELT may be located directly on the first and second end portions EP1 and EP2 of the light emitting elements LD to be in contact with the first and second end portions EP1 and EP2 of the light emitting elements LD.

The pixel electrodes ELT may be configured as a plurality of conductive layers to be located in different layers. For example, first and third pixel electrodes ELT1 and ELT3 may be located on the second insulating layer INS2. The first and third pixel electrodes ELT1 and ELT3 may be configured as the same conductive layer. The first and third pixel electrodes ELT1 and ELT3 may be concurrently/substantially simultaneously formed through the same process, but the present disclosure is not necessarily limited thereto.

Second and fourth pixel electrodes ELT2 and ELT4 may terminate above the light emitting element LD at a layer that is higher than a layer at which the first and third pixel electrodes ELT1 and ELT3 terminate above the light emitting element LD. The second and fourth pixel electrodes ELT2 and ELT4 may be configured as the same conductive layer. The second and fourth pixel electrodes ELT2 and ELT4 may be concurrently/substantially simultaneously formed through the same process, but the present disclosure is not necessarily limited thereto.

When the pixel electrodes ELT are configured as a plurality of conductive layers, an insulating layer may be located between the plurality of conductive layers. For example, a third insulating layer INS3 may be further located between the first and third pixel electrodes ELT1 and ELT3 and the second and fourth pixel electrodes ELT2 and ELT4. The third insulating layer INS3 covers the first and third pixel electrodes ELT1 and ELT3, and may expose the second end portions EP2 of the light emitting elements LD. For example, the third insulating layer INS3 may include a first opening OP1 exposing second end portions EP2 of first light emitting elements LD1, and a second opening OP2 exposing second end portions EP2 of second light emitting elements LD2. In some embodiments, the first and second openings OP1 and OP2 may be located at outer portions in the emission area EA. That is, the third insulating layer INS3 may be opened at an outer portion to be located in the middle in the emission area EA. Light emitted from the light emitting elements LD may be incident into the third insulating layer INS3 to be waveguided by the third insulating layer INS3, which may be made of a high refractive material, and then to be output in the middle of the emission area EA. Accordingly, the light emission profile of the pixel PX can be improved, thereby enhancing the light emission efficiency of the display panel PNL.

To this end, the first and second openings OP1 and OP2 may be spaced apart from each other with respect to the center of the pixel PXL or the emission area EA. For example, the first and second openings OP1 and OP2 may be respectively located at positions that are symmetrical to each other with respect to the center of the pixel PXL or the emission area EA, but the present disclosure is not necessarily limited thereto. For example, the first and second openings OP1 and OP2 may be spaced apart from each other with the first alignment electrode ALE1 interposed therebetween. The first and second openings OP1 and OP2 may be respectively located at positions that are symmetrical to each other with respect to the first alignment electrode ALE1, but the present disclosure is not necessarily limited thereto. Also, the first and second openings OP1 and OP2 may be spaced apart from each other with the first pattern BNP1 interposed therebetween. The first and second openings OP1 and OP2 may be respectively located at positions that are symmetrical to each other with respect to the first pattern BNP1, but the present disclosure is not necessarily limited thereto. Also, the first and second openings OP1 and OP2 may be spaced apart from each other with the first end portions EP1 of the light emitting elements LD interposed therebetween. The first and second openings OP1 and OP2 may be respectively located at positions that are symmetrical to each other with respect to the first end portions EP1 of the light emitting elements LD, but the present disclosure is not necessarily limited thereto.

The second and fourth pixel electrodes ELT2 and ELT4 may be located on the second end portion of the respective light emitting element LD, which is exposed by the opening OP of the third insulating layer INS3. For example, the second pixel electrode ELT2 may be located on the second end portions EP2 of the first light emitting elements LD1, which are exposed by the first opening OP1 of the third insulating layer INS3, to be in contact with the second end portions EP2 of the first light emitting elements LD1. The fourth pixel electrode ELT4 may be located on the second end portions EP2 of the second light emitting elements LD2, which are exposed by the second opening OP2 of the third insulating layer INS3, to be in contact with the second end portions EP2 of the second light emitting elements LD2.

As described above, when the third insulating layer INS3 is located between the pixel electrodes ELT configured as different conductive layers, the pixel electrodes ELT can be stably separated by the third insulating layer INS3. Thus, electrical stability between the first and second end portions EP1 and EP2 of the light emitting elements LD can be ensured. Accordingly, the occurrence of a short-circuit defect between the first and second end portions EP1 and EP2 of the light emitting elements LD can be effectively reduced or prevented.

At least one of the pixel electrodes ELT may be electrically connected to the alignment electrodes ALE or other pixel electrodes ELT through a contact part CNT or a contact hole CH, which penetrates the first insulating layer INS1 and/or the third insulating layer INS3, at the bottom thereof.

For example, as shown in FIG. 7, the first pixel electrode ELT1 may be in contact with the first alignment electrode ALE1 through a first contact part CNT1 penetrating the first insulating layer INS1 located on the bottom thereof. The first contact part CNT1 may be located in the second non-emission area NEA2, but the present disclosure is not necessarily limited thereto.

In addition, as shown in FIG. 8, the fourth pixel electrode ELT4 may be in contact with the second alignment electrode ALE2 through a second contact part CNT2 penetrating the first insulating layer INS1 and/or the third insulating layer INS3, and located at the bottom thereof. The second contact part CNT2 may be located in the second non-emission area NEA2, but the present disclosure is not necessarily limited thereto.

In addition, as shown in FIG. 9, the second pixel electrode ELT2 may be in contact with the third pixel electrode ELT3 through a contact hole CH penetrating the first insulating layer INS1 and/or the third insulating layer INS3 located at the bottom thereof. The contact hole CH may be located in the second non-emission area NEA2, but the present disclosure is not necessarily limited thereto.

The pixel electrodes ELT may be made of various transparent conductive materials. For example, the pixel electrodes ELT may include at least one of various transparent conductive materials including Indium Tin Oxide (ITO), Indium Zinc Oxide (IZO), Indium Tin Zinc Oxide (ITZO), Zinc Oxide (ZnO), Aluminum doped Zinc Oxide (AZO), Gallium doped Zinc Oxide (GZO), Zinc Tin Oxide (ZTO), Gallium Tin Oxide (GTO), and/or Fluorine doped Tin Oxide (FTO), and may be implemented substantially transparently or translucently to satisfy a transmittance (e.g., a predetermined transmittance). Accordingly, light emitted from the first and second end portions EP1 and EP2 of the light emitting elements LD can be emitted to the outside of the display panel PNL while passing through the pixel electrodes ELT.

In accordance with the above-described embodiments, the third insulating layer IN3 is opened at an outer portion to be located in the middle in the emission area EA, so that light incident into the third insulating layer INS3 can be output in the middle of the emission area EA. Accordingly, the light emission profile of the pixel PX can be improved, thereby enhancing the light emission efficiency of the display panel PNL.

Figure 10:
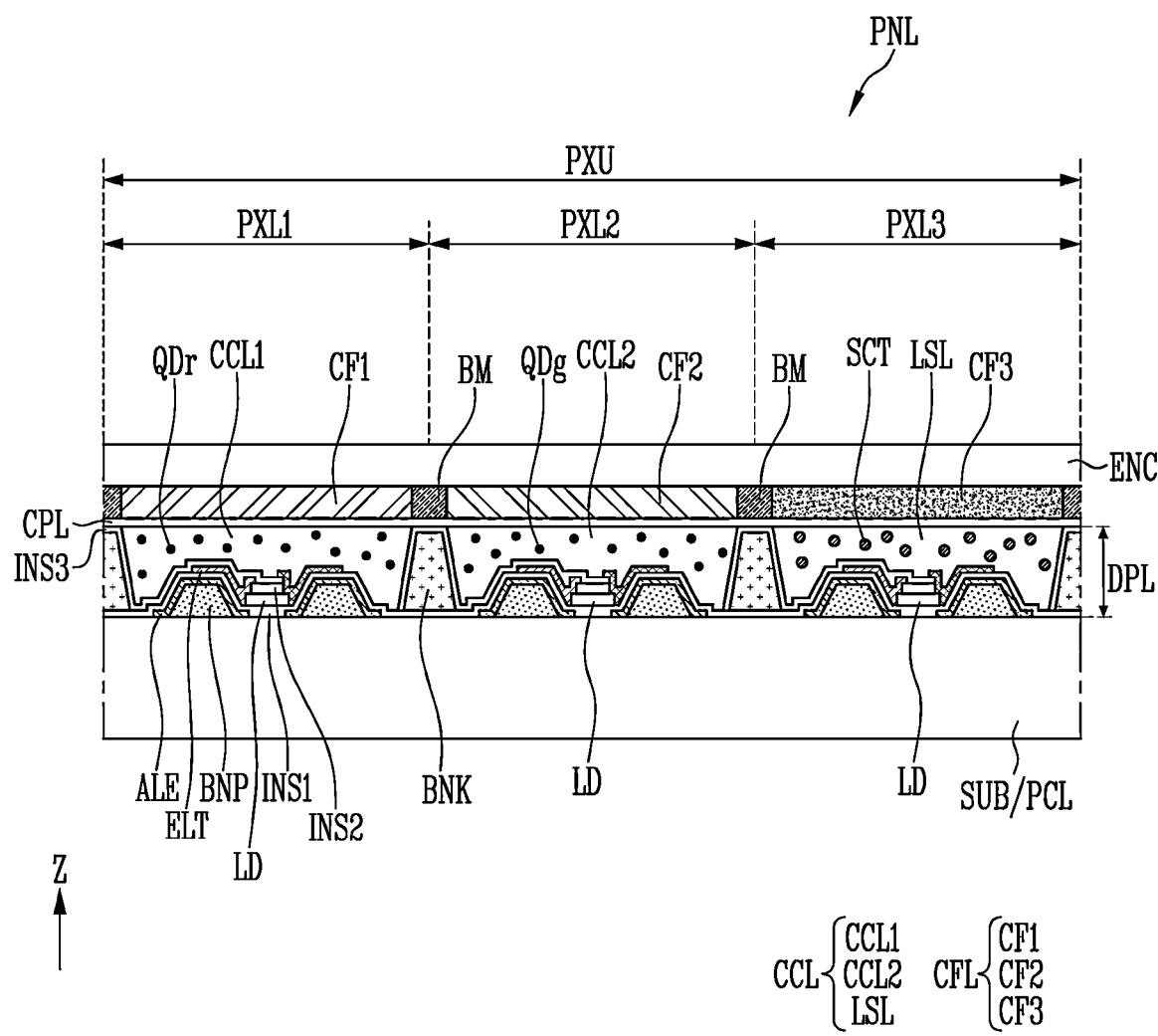
FIG. 10 is a sectional view illustrating a display panel in accordance with some embodiments of the present disclosure.

FIG. 10 is a sectional view illustrating a display panel in accordance with some embodiments of the present disclosure.

In FIG. 10, a section of a display device, for example, a display panel PNL provided in the display device, will be illustrated based on an area in which any one pixel unit PXU configured with a first pixel PXL1, a second pixel PXL2, and a third pixel PXL3, which are adjacent to each other, is located.

Referring to FIG. 10, a color conversion layer CCL, a capping layer CPL, and a color filter layer CFL may be located on the display layer DPL.

The color conversion layer CCL may be located over light emitting elements LD in an opening of a bank BNK. The color conversion layer CCL may include a first color conversion layer CCL located in the first pixel PXL1, a second color conversion layer CCL2 located in the second pixel PXL2, and a light scattering layer LSL located in the third pixel PXL3.

In some embodiments, the first to third pixels PXL1, PXL2, and PXL3 may include light emitting elements LD emitting light of the same color. For example, the first to third pixels PXL1, PXL2, and PXL3 may include light emitting elements LD emitting light of a third color (e.g., light of blue having a wavelength band of about 400 nm to about 500 nm). The color conversion layer CCL including color conversion particles is located on some pixels PXL among the first to third pixels PXL1, PXL2, and PXL3, so that a full-color image can be displayed. However, the present disclosure is not necessarily limited thereto, and the first to third pixels PXL1, PXL2, and PXL3 may include light emitting elements LD for emitting light of different colors. For example, the first pixel PXL1 may include a first color (or red) light emitting element LD, the second pixel PXL2 may include a second color (or green) light emitting element LD, and the third pixel PXL3 may include a third color (or blue) light emitting element LD.

The first color conversion layer CCL1 may include first color conversion particles for converting light of the third color, which is emitted from the light emitting element LD, into light of the first color. For example, when the light emitting element LD is a blue light emitting element for emitting blue light, and when the first pixel PXL1 is a red pixel, the first color conversion layer CCL1 may include a first quantum dot QDr for converting blue light, which is emitted from the blue light emitting element, into red light. For example, the first color filter conversion layer CCL1 may include a plurality of first quantum dots QDr dispersed in a matrix material (e.g., a predetermined matrix material) such as base resin. The first quantum dot QDr may absorb blue light and emit red light having a wavelength band of about 620 nm to about 780 nm by shifting a wavelength of the blue light according to energy transition. Meanwhile, when the first pixel PXL1 is a pixel of another color, the first color conversion layer CCL1 may include a first quantum dot corresponding to the color of the first pixel PXL1.

The second color conversion layer CCL2 may include second color conversion particles for converting light of the third color, which is emitted from the light emitting element LD, into light of the second color. For example, when the light emitting element LD is a blue light emitting element for emitting blue light, and when the second pixel PXL2 is a green pixel, the second color conversion layer CCL2 may include a second quantum dot QDg for converting blue light, which is emitted from the blue light emitting element, into green light. For example, the second color filter conversion layer CCL2 may include a plurality of second quantum dots QDg dispersed in a matrix material (e.g., a predetermined matrix material), such as base resin. The second quantum dot QDg may absorb blue light and emit green light having a wavelength band of about 500 nm to about 570 nm by shifting a wavelength of the blue light according to energy transition. Meanwhile, when the second pixel PXL2 is a pixel of another color, the second color conversion layer CCL2 may include a second quantum dot corresponding to the color of the second pixel PXL2.

For example, blue light having a relatively short wavelength in a visible light band is incident into the first quantum dot QDr and the second quantum dot QDg, so that absorption coefficients of the first quantum dot QDr and the second quantum dot QDg can be increased. Accordingly, the efficiency of light finally emitted from the first pixel PXL1 and the second pixel PXL2 can be improved, and excellent color reproduction can be ensured. In addition, the light emitting unit EMU of each of the first to third pixels PXL1, PXL2, and PXL3 is configured by using light emitting elements of the same color (e.g., blue light emitting elements), so that the manufacturing efficiency of the display device can be improved.

The light scattering layer LSL may be selectively provided to efficiently use light of the third color (or blue) emitted from the light emitting element LD. For example, when the light emitting element LD is a blue light emitting element for emitting blue light, and when the third pixel PXL3 is a blue pixel, the light scattering layer LSL may include at least one kind of light scattering particles SCT to efficiently use light emitted from the light emitting element LD.

For example, the light scattering layer LSL may include a plurality of light scattering particles SCT dispersed in a matrix material (e.g., a predetermined matrix material), such as base resin. For example, the light scattering layer LSL may include light scattering particles SCT such as silica, but the material constituting the light scattering particles SCT is not limited thereto. Meanwhile, the light scattering particles SCT are not located in only the third pixel PXL3. For example, the light scattering particles SCT may be selectively included even at the inside of the first color conversion layer CCL1 or the second color conversion layer CCL2.

The capping layer CPL may be located on the color conversion layer CCL. The capping layer CPL may directly cover the color conversion layer CCL. One surface of the capping layer CPL may be in contact with the color conversion layer CCL, and the other surface of the capping layer CPL may be in contact with the color filter layer CFL, which will be described later. The capping layer CPL may be located throughout the first to third pixels PXL1, PXL2, and PXL3. The capping layer CPL may reduce or prevent the likelihood of the color conversion layer CCL being damaged or contaminated due to infiltration of an impurity such as moisture or air from the outside. The capping layer CPL is an inorganic layer, and may include silicon nitride (SiNx), aluminum nitride (AlNx), titanium nitride (TiNx), silicon oxide (SiOx), aluminum oxide (AlOx), titanium oxide (TiOx), silicon oxycarbide (SiOxCy), silicon oxynitride (SiOxNy), and/or the like.

The color filter layer CFL may be located on the capping layer CPL. The color filter layer CFL may be located directly on the capping layer CPL. The color filter layer CFL may include a color filter corresponding to a color of each pixel PXL. For example, the color filter layer CFL may include a first color filter CF1 located in the first pixel PXL1 to allow light generated in the first pixel PXL1 to be selectively transmitted therethrough, a second color filter CF2 located in the second pixel PXL2 to allow light generated in the second pixel PXL2 to be selectively transmitted therethrough, and a third color filter CF3 located in the third pixel PXL3 to allow light generated in the third pixel PXL3 to be selectively transmitted therethrough. In some embodiments, the first color filter CF1, the second color filter CF2, and the third color filter CF3 may be respectively a red color filter, a green color filter, and a blue color filter, but the present disclosure is not necessarily limited thereto. Hereinafter, when an arbitrary color among the first color filter CF1, the second color filter CF2, and the third color filter CF3 is designated, or when two or more kinds of color filters are inclusively designated, the corresponding color filter or the corresponding color filters will be referred to as a "color filter CF" or "color filters CF."

The first color filter CF1 may overlap with the first color conversion layer CCL1 in the third direction (Z-axis direction). The first color filter CF1 may include a color filter material for allowing light of the first color (or red) to be selectively transmitted therethrough. For example, when the first pixel PXL1 is a red pixel, the first color filter CF1 may include a red color filter material.

The second color filter CF2 may overlap with the second color conversion layer CCL2 in the third direction (Z-axis direction). The second color filter CF2 may include a color filter material for allowing light of the second color (or green) to be selectively transmitted therethrough. For example, when the second pixel PXL2 is a green pixel, the second color filter CF2 may include a green color filter material.

The third color filter CF3 may overlap with the light scattering layer LSL in the third direction (Z-axis direction). The third color filter CF3 may include a color filter material for allowing light of the third color (or blue) to be selectively transmitted therethrough. For example, when the third pixel PXL3 is a blue pixel, the third color filter CF2 may include a blue color filter material.

A light blocking pattern BM may be located between the color filters CF. The light blocking pattern BM may be located at a boundary or edge of the first to third pixels PXL1, PXL2, and PXL3 while not overlapping with emission areas of the pixels PXL. For example, the light blocking pattern BM may be located to overlap with the bank BNK in the third direction (Z-axis direction). The light blocking pattern BM may include at least one of various kinds of light blocking materials and/or a color filter material of a specific color. Meanwhile, the light blocking pattern BM may be omitted in some embodiments. The first to third color filters CF1, CF2, and CF3 may be located to overlap with each other at the boundary of the first to third pixels PXL1, PXL2, and PXL3.

An encapsulation layer ENC may be located on the color filter layer CFL. The encapsulation layer ENC may cover the color filter layer CFL, the color conversion layer CCL, the display layer DPL, and the circuit layer PCL, which are located thereunder. The encapsulation layer ENC may reduce or prevent moisture or air from infiltrating therebelow. To this end, the encapsulation layer ENC may include at least one inorganic layer. For example, the inorganic layer may include at least one of aluminum nitride (AlNx), silicon oxide (SiOx), silicon nitride (SiNx), silicon oxynitride (SiOxNy), zirconium oxide (ZrOx), hafnium oxide (HfOx), and/or titanium oxide (TiOx), but the present disclosure is not necessarily limited thereto. Also, the encapsulation layer ENC may protect the layers therebelow from a foreign matter such as dust. To this end, the encapsulation layer ENC may include at least one organic layer. For example, the organic layer may be acryl resin, epoxy resin, phenolic resin, polyamides resin, or polyim ides resin, but the present disclosure is not necessarily limited thereto. As described above, when the encapsulation layer ENC is located on the color filter layer CFL, a separate upper substrate may be omitted, and thus the thickness of the display panel PNL can be reduced or minimized, thereby improving the light efficiency.

In accordance with the above-described embodiments, the third insulating layer INS3 is located in the middle of the emission area EA, so that light incident into the third insulating layer INS3 can be guided to the middle of the emission area EA. That is, because the light emission profile of the pixel PXL is improved, an amount of light incident into the color conversion layer CCL can be increased, and thus the light emission efficiency of the pixel PXL can be enhanced.

Hereinafter, other embodiments will be described. In the following embodiments, components identical to those described above are designated by like reference numerals, and overlapping descriptions will be omitted or simplified.

Figure 11:
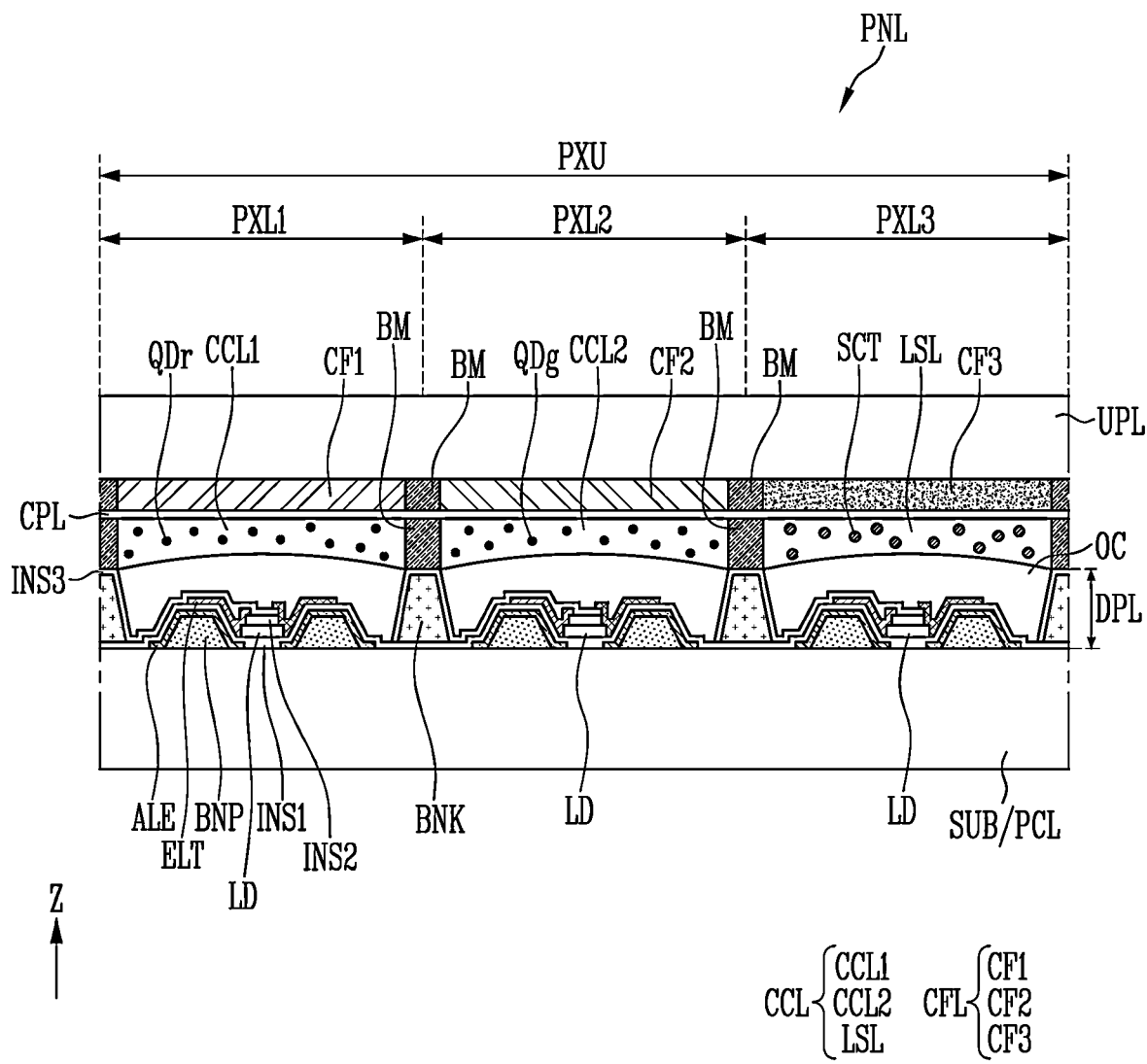
FIG. 11 is a sectional view illustrating a display panel in accordance with other embodiments of the present disclosure.

FIG. 11 is a sectional view illustrating a display panel in accordance with other embodiments of the present disclosure.

Referring to FIG. 11, a display device in accordance with some embodiments is different from the embodiments of FIG. 10, in that an upper substrate UPL is located on a substrate SUB on which first to third pixels PXL1, PXL2, and PXL3 are located.

For example, the upper substrate UPL (also, referred to as an "encapsulation substrate" or "color filter substrate") that encapsulates the first to third pixels PXL1, PXL2, and PXL3 may be located on one surface of the substrate SUB. In some embodiments, the upper substrate UPL may include a color conversion layer CCL, a capping layer CPL, and a color filter layer CFL, which overlap with the first to third pixels PXL1, PXL2, and PXL3. In some embodiments, a space between a lower plate of the display panel PNL, which includes the substrate SUB, a display layer DPL, and the like, and an upper plate of the display panel PNL, which includes the upper substrate UPL, the color filter layer CFL, the color conversion layer CCL, and the like, may be filled with an air layer or an overcoat layer OC having a relatively low refractive index in a range of about 1 to about 1.6.

The color conversion layer CCL, the capping layer CPL, and the color filter layer CFL may be located on one surface of the upper substrate UPL. For example, the color filter layer CFL may be formed on the upper substrate UPL, the capping layer CPL may be formed on the color filter layer CFL, and the color conversion layer CCL may be formed on the color filter layer CFL and the capping layer CPL. However, the present disclosure is not necessarily limited thereto, and the forming order of the color conversion layer CCL, the capping layer CPL, and the color filter layer CFL, as well as the shapes according thereto, may be variously changed.

In some embodiments, a light blocking pattern BM may be located between first to third color filters CF1, CF2, and CF3. The light blocking pattern BM may be located at a boundary or edge of the pixels PXL not to overlap with emission areas of the pixels PXL. For example, the light blocking pattern BM may be located to overlap with a bank BNK. Although FIG. 11 shows a case where the light blocking pattern BM is located on the upper substrate UPL, and where the first to third color filters CF1, CF2, and CF3 are respectively located in areas partitioned by the light blocking pattern BM, the present disclosure is not necessarily limited thereto. For example, when it is unnecessary to first form the light blocking pattern BM according to a process method and/or performance of printing equipment, the light blocking pattern BM may be formed after the first to third color filter CF1, CF2, and CF3 are first formed. That is, the forming order of the color filters CFL and/or the position or shape according thereto may be variously changed in some embodiments.

Similarly, a light blocking pattern BM may be further located between first and second color conversion layers CCL1 and CCL2 and a light scattering layer LSL. The light blocking pattern BM may be located at a boundary or edge of the pixels PXL not to overlap with the emission areas of the pixels PXL. For example, the light blocking pattern BM may be located on the capping layer CPL, and the first color conversion layer CCL1, the second color conversion layer CCL2, and the light scattering layer LSL may be respectively located in areas partitioned by the light blocking pattern BM. However, the present disclosure is not necessarily limited thereto. For example, when it is unnecessary to first form the light blocking pattern BM according to a process method and/or performance of printing equipment, the light blocking pattern BM may be formed after the first color conversion layer CCL1, the second color conversion layer CCL2, and the light scattering layer LSL are first formed. That is, the forming order of the color conversion layers CCL and/or the position or shape according thereto may be variously changed in some embodiments.

The color conversion layer CCL, the capping layer CPL, and the color filter layer CFL have been described above with reference to FIG. 10, and therefore, overlapping descriptions will be omitted.

In accordance with the present disclosure, an insulating layer located between pixel electrodes is opened at an outer portion of an emission area to be located in the middle in the emission area, so that light incident into the insulating layer can be waveguided and then induced to the center of the emission area. Accordingly, the light emission profile of the pixel can be improved, and thus the light emission efficiency of the display device can be enhanced.

Embodiments have been disclosed herein, and although specific terms are employed, they are used and are to be interpreted in a generic and descriptive sense only, and not for purpose of limitation. In some instances, as would be apparent to one of ordinary skill in the art as of the filing of the present application, features, characteristics, and/or elements described in connection with some embodiments may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims, with functional equivalents thereof to be included therein.

What is claimed is:

1. A display device comprising:
alignment electrodes spaced apart from each other;
first light emitting elements and second light emitting elements between the alignment electrodes;
a first pixel electrode electrically connected to first end portions of the first light emitting elements;
a second pixel electrode electrically connected to second end portions of the first light emitting elements;
a third pixel electrode electrically connected to the second pixel electrode and to first end portions of the second light emitting elements;
a fourth pixel electrode electrically connected to second end portions of the second light emitting elements;
an insulating layer between the first pixel electrode and the second pixel electrode in plan view, such that the insulating layer overlaps portions of the first pixel electrode above the first light emitting elements with the portions of the first pixel electrode between the first light emitting elements and the insulating layer in a thickness direction of the display device, and such that the second pixel electrode overlaps portions of the insulating layer above the first light emitting elements with the portions of the insulating layer between the first light emitting elements and the second pixel electrode in the thickness direction of the display device;
an emission area;
a first non-emission area surrounding the emission area; and
a second non-emission area spaced apart from the emission area with at least a portion of the first non-emission area interposed therebetween, and having therein a contact hole penetrating the insulating layer through which the second pixel electrode is electrically connected to the third pixel electrode, the second pixel electrode and the third pixel electrode being at different respective layers,
wherein the insulating layer defines a first opening exposing the second end portions of the first light emitting elements, and a second opening exposing the second end portions of the second light emitting elements, and
wherein a portion of the insulating layer covering the first end portions of the first light emitting elements and the first end portions of the second light emitting elements is between the first opening and the second opening in plan view.

2. The display device of claim 1, wherein the second pixel electrode is in contact with the second end portions of the first light emitting elements through the first opening of the insulating layer.

3. The display device of claim 1, wherein the fourth pixel electrode is in contact with the second end portions of the second light emitting elements through the second opening of the insulating layer.

4. The display device of claim 1, wherein the insulating layer is between the second pixel electrode and the third pixel electrode.

5. The display device of claim 1, wherein the insulating layer covers the first pixel electrode.

6. The display device of claim 1, wherein the insulating layer covers the third pixel electrode.

7. The display device of claim 1, wherein the alignment electrodes comprise a first alignment electrode, a second alignment electrode, and a third alignment electrode,
wherein the first light emitting elements are between the first alignment electrode and the third alignment electrode, and
wherein the second light emitting elements are between the first alignment electrode and the second alignment electrode.

8. The display device of claim 7, wherein the first end portions of the first and second light emitting elements face the first alignment electrode.

9. The display device of claim 7, wherein the second end portions of the first light emitting elements face the third alignment electrode, and
wherein the second end portions of the second light emitting elements face the second alignment electrode.

10. The display device of claim 7, wherein the first pixel electrode is electrically connected to the first alignment electrode.

11. The display device of claim 7, wherein the fourth pixel electrode is electrically connected to the second alignment electrode.

12. The display device of claim 11, wherein the fourth pixel electrode is electrically connected to the second alignment electrode through a second contact hole penetrating the insulating layer.

13. The display device of claim 7, wherein the first alignment electrode is between the first opening and the second opening.

14. The display device of claim 1, wherein the first pixel electrode and the third pixel electrode are in a same layer.

15. The display device of claim 1, wherein the second pixel electrode and the fourth pixel electrode are in a same layer.

16. The display device of claim 1, wherein the first end portions of the first light emitting elements and the second light emitting elements are between the first opening and the second opening.

17. The display device of claim 1, further comprising a bank in the first non-emission area.

18. The display device of claim 1, wherein the second pixel electrode and the third pixel electrode are in contact with each other in the second non-emission area.

* * * * *